United States Patent

Tanaka et al.

Patent Number: 5,100,762
Date of Patent: Mar. 31, 1992

[54] RADIATION-SENSITIVE POLYMER AND RADIATION-SENSITIVE COMPOSITION CONTAINING THE SAME

[75] Inventors: Youko Tanaka; Shigeru Kubota; Hideo Horibe; Hiroshi Koezuka; Teruhiko Kumada, all of Hyogo, Japan

[73] Assignee: Mitsubishi Denki Kabushiki Kaisha, Japan

[21] Appl. No.: 549,736

[22] Filed: Jul. 9, 1990

[30] Foreign Application Priority Data

Jul. 10, 1989 [JP] Japan .................. 1-178713
Mar. 20, 1990 [JP] Japan .................. 2-71390

[51] Int. Cl.$^5$ .............................................. G03C 1/492
[52] U.S. Cl. ............................. 430/270; 526/240; 526/241; 556/94
[58] Field of Search ................ 430/270; 526/240, 241; 556/94

[56] References Cited

U.S. PATENT DOCUMENTS

| | | | |
|---|---|---|---|
| 3,012,018 | 12/1961 | Marinelli et al. | 556/94 |
| 3,016,369 | 1/1962 | Montermoso et al. | 556/94 |
| 3,167,532 | 1/1965 | Leebrick | 556/94 |
| 3,403,169 | 9/1968 | Rudner et al. | 556/94 |
| 4,708,925 | 11/1987 | Newman | 430/270 |
| 4,820,607 | 4/1989 | Aoai | 430/270 |
| 4,904,563 | 2/1990 | Aoai et al. | 430/270 |
| 4,988,605 | 1/1991 | Kubota et al. | 430/270 |

OTHER PUBLICATIONS

Ito et al., J. Electrochem. Soc., Solid State Sci and Tech., 135(9), 2322-2327.
Labadie et al., Macromolecules 1987 (20), 10-15.

Primary Examiner—Marion E. McCamish
Assistant Examiner—Mark A. Chapman
Attorney, Agent, or Firm—Wolf, Greenfield & Sacks

[57] ABSTRACT

A radiation-sensitive polymer is capable of resistance to the dry etching when it is applied to form very fine patterns in VLSIs and other semiconductor devices, wherein the polymer is a radiation-sensitive polymer that contains at least one unit represented by the general formula (I):

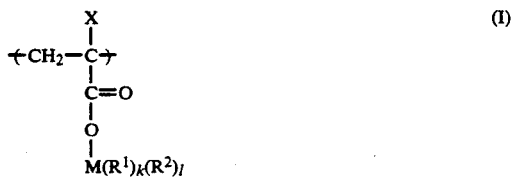

(where X is an alkyl group, a halogen atom or a halogenated alkyl group; $R^1$ is an alkyl group, an alkoxy or an aryl group; $R^2$ is carbon monoxide; M is Si, Ge, Sn, Ti, Mo or W; k is a number defined by the valence of (M minus 1); and l is zero or a positive integer), and which optionally contains at least one unit represented by the general formula (II):

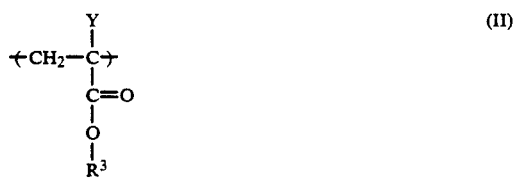

(where Y is an alkyl group, a halogen atom or a halogenated alkyl group; $R^3$ is an alkyl group or an aryl group) and/or at least one unit represented by the general formula (III):

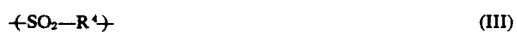

(where $R^4$ is a divalent alkyl or aryl group).

90 Claims, 1 Drawing Sheet

RADIATION-SENSITIVE POLYMER AND RADIATION-SENSITIVE COMPOSITION CONTAINING THE SAME

BACKGROUND OF THE INVENTION

This invention relates to a radiation-sensitive polymer capable of resistance to dry etching when it is applied to form very fine patterns in VLSI's and other semiconductor devices. The invention also relates to a radiation-sensitive composition containing said polymer.

While various microfabrication processes are known today that have been proposed to meet the growing demand for increasing the level of integration and packing density in semiconductor devices, a lithographic technique involving the formation of a multilayer film is under review (see FIGS. 1 and 2). This technique consists of forming a thick flat layer on a semiconductor substrate, then forming several thin layers containing a resist layer, and allowing the pattern in an upper layer to be transferred successively onto underlying layers by a suitable method such as dry etching. Conventionally, three or two layers are formed on the thick flat layer as shown in FIG. 2. A transfer method using a three-layer system is illustrated in FIG. 2 and consists of the following steps: forming a flat layer 5 on a semiconductor substrate 6; providing the flat layer 5 with an undercoat 4 that is resistant to a halogen gas plasma; providing the undercoat 4 with an intermediate layer 3 that is resistant to the oxygen plasma etching; forming a resist layer 2 on the intermediate layer 3; exposing the resist layer 2 imagewise through a mask 1; developing the resist layer 2 to form a pattern on it; transferring the resulting resist pattern 2a onto the intermediate layer 3 by plasma etching with a fluorine-containing gas; transferring the intermediate pattern 3a onto the undercoat 4 by the oxygen plasma etching; and further transferring the undercoat pattern 4a onto the flat layer 5 by plasma etching with a fluorine-containing gas. This process, however, has had the problem that several dry etching processes are necessary to transfer patterns and, therefore, the number of steps involved increases making the process complicated.

To overcome this problem, a single-layer resist process has been proposed which, as shown in FIG. 1, provides the flat thick layer 5 with a resist layer 7 that withstands dry etching. According to this process, the resist layer 7 is exposed through a mask 1 and developed to form a resist pattern 7a on the flat layer 5, with said pattern being transferred onto the flat layer by dry etching. Various compounds including chloromethylated polydiphenylsiloxane and chloromethylated polyphenylmethylsilane have been reviewed for use as resist materials that withstand the drying etching performed in this process. However, controlling the chloromethylated reaction is so difficult that these resist materials have a relatively broad molecular weight distribution due to the decrease in their molecular weight and low resolution will result in the use of such resist materials. Further, it is difficult to control the quality of the synthesized products since their characteristics are variable from lot to lot.

The resist material used in lithographic process by radiation exposure are classified into two groups, organics and inorganics. The term "radiation" as used herein covers all high-energy radiations including ultraviolet light, deep-ultraviolet light, electron beams and X-rays.

Organic resist materials, for example, polymethyl methacrylate (hereinafter abbreviated as "PMMA"), polyglycidyl methacrylate, polyhydroxystyrene, polyether sulfone and novolak resins, are used as binders and are available as a two-component system that also contains a suitable photo-sensitive compounds. A suitable acid generator may be added to this two-component system in order to cause chemical amplification and such a three-component system is also studied and be developed.

The organic resist materials have a good capacity to form homogeneous films, and high sensitivities at a specific wavelength allowing efficient development. However, most of the conventional organic resist materials are rather poor in resistance to the dry etching which is one of the steps involved in microfabrication processes. PMMA which has been known to be studied most extensively of the photo-sensitive resist materials today has the advantage of high resolution and low cost. However, PMMA is not highly resistant to dry etching or does not have high sensitivity. It has been attempted to improved the dry etching resistance by introducing a halogenated alkyl or phenyl group into the side chains (see Japanese Patent Public Disclosure Nos. 18638/1980, 254041/1985 and 234006/1988) but the modified PMMA is still unsatisfaction with regand to sensitivity and resolution. Polymers having benzene rings, such as polyhydroxystyrene, have also been studied to evaluate their lithographic properties for use as resist materials in microfabrication processes using high-energy radiations as a light source (see Japanese Patent Public Disclosure No. 446/1985). These polymers are yet to be used commercially for the sake of their lower resistance to the dry etching than that of novolak resins which are conventionally used in these applications.

Inorganic resist materials that have been studied and developed so far include amorphous chalcogenides and crystalline tungstenic acid. Inorganic resist materials show high resistance to oxygen gas plasma but give relatively heterogeneous coating films. For example, the formation of this films that utilize the high photo-sensitivity of amorphous chalcogenides (Japanese Patent Public Disclosure No. 27137/1981) requires a vacuum evaporation or sputtering, and the processing apparatus is expensive and yet achieves only a small throughput. In an attempt to solve these problems, crystalline condensed tungstenic acid that can be coated to form a film has been proposed (Japanese Patent Public Disclosure No. 100448/1988). This has improved sensitivity to radiations but achieves only limited resolution. Further, this is only compatible with a two-layered resist process.

Active efforts have also been made to develop resist materials that combine the advantages of organic resist materials with those of inorganics. For example, a photo-decomposable polymer such as PMMA which is an organic resist material has been mixed with an organometallic compound (see Japanese Patent Public Disclosure No. 202441/1983). However, this resist material has not yet been used commercially since it suffers the problem that an insoluble layer in a liquid developer forms on the resist surface during prebaking. Further, the organometallic compound is a key factor to providing resistance to the plasma etching due to miscibility problem, but there is only limited latitude in increasing the addition of this compound. Other problems associated with the blend system under consideration are low photo-sensitivity and low resolution.

As described above, no resist material has yet been attained that is suitable for use in a single-layered resist process of microfabrication on account of high radiation sensitivity, high resolution, high resistance to the dry etching and good film-forming property. The advent of such resist material has therefore been strongly desired.

SUMMARY OF THE INVENTION

An object, therefore, of the present invention is to provide a radiation-sensitive polymer suitable for a resist material that is fitted to this need.

Another object of the present invention is to provide a radiation-sensitive composition that contains said polymer.

The first object of the present invention can be attained by a radiation-sensitive polymer that contains at least one unit represented by the general formula (I):

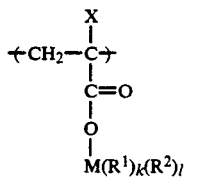

(where X is an alkyl group, a halogen atom or a halogenated alkyl group; $R^1$ is at least one of an alkyl group, an alkoxy group and an aryl group; $R^2$ is carbon monoxide; M is Si, Ge, Sn, Ti, Mo or W; k is a number defined by the valence of (M minus 1) and l is zero or a positive integer provided that l is zero in the case that M is Si, Ge or Sn), and which optionally contains at least one unit represented by the general formula (II):

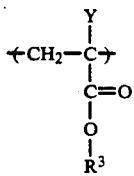

(where Y is an alkyl group, a halogen atom or a halogenated alkyl group; $R^3$ is an alkyl group or an aryl group) and/or at least one unit represented by the general formula (III):

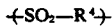

(where $R^4$ is a divalent alkyl or aryl group).

The second object of the present invention can be attained by a radiation-sensitive composition that comprises the radiation-sensitive polymer described above and a compound that generates an acid owing to the reaction by the irradiation and/or a compound that provides enhanced sensitivity to the radiation.

The radiation-sensitive polymer of the present invention satisfies the requirements for high dry etching resistance, sensitivity and resolution. If this polymer is used as a resist material, ultrafine patterns of high aspect ratio can be easily formed, whereby the high level of integration necessary to fabricate VLSI's can be achieved. The composition of the present invention which contains this polymer has the advantage of providing even higher sensitivity.

DETAILED DESCRIPTION OF THE INVENTION

Figure 1:
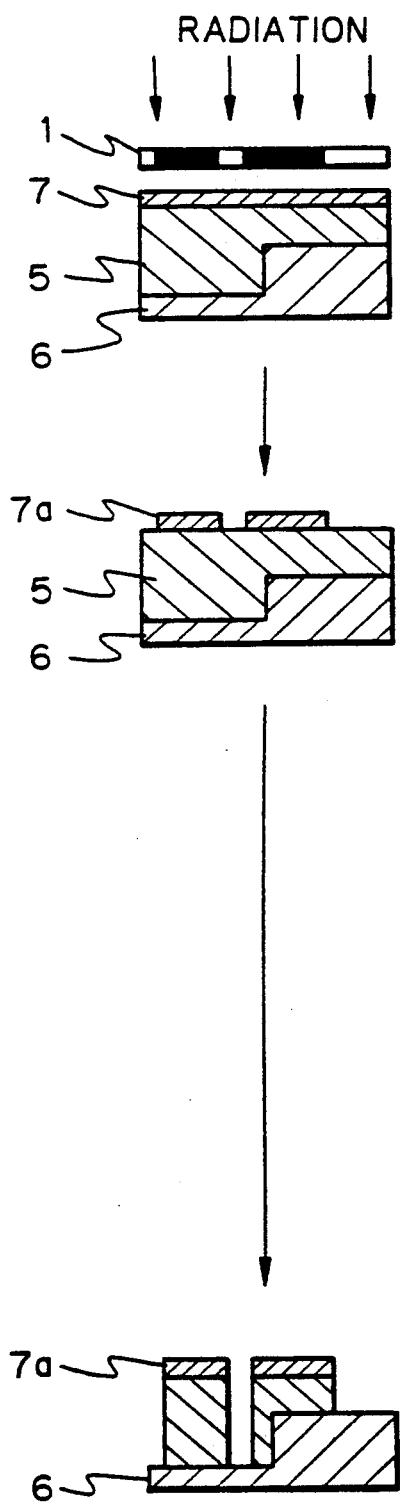
FIG. 1 shows in cross section the steps of a single-layered resist process.
Figure 2:
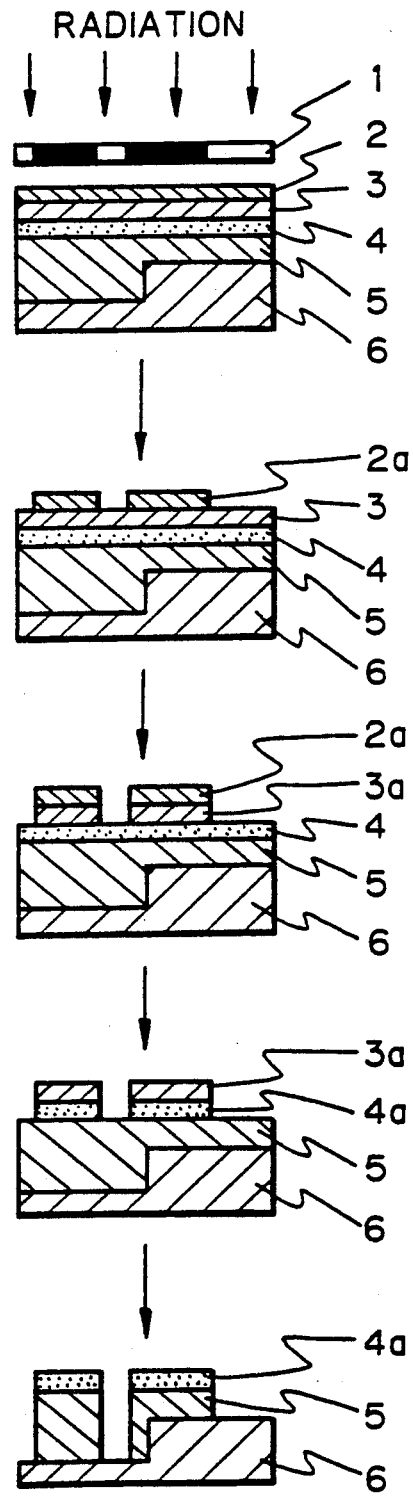
FIG. 2 shows in cross section the steps of a three-layered resist process.

The radiation-sensitive polymer of the present invention contains at least one unit represented by the general formula (I):

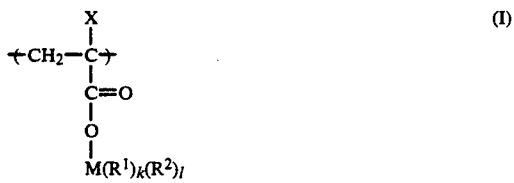

(where X is an alkyl group, a halogen atom or a halogenated alkyl group; $R^1$ is at least one of an alkyl group, an alkoxy group and an aryl group; $R^2$ is carbon monoxide; M is Si, Ge, Sn, Ti, Mo or W; k is a number defined by the valence of (M minus 1); and l is zero or a positive integer provided l is zero in the case that M is Si, Ge or Sn). The radiation-sensitive polymer of the present invention may contain two or more units (I) where $R^1$, X and M are different.

If X in the general formula (I) is an alkyl group, it may be exemplified by methyl, ethyl, n-propyl, isopropyl, n-butyl, t-butyl, etc. Improved radiation sensitivity can be achieved if X is a halogen atom, particularly chlorine. Even higher sensitivity can be realized if X is a halogenated alkyl group. Specific examples of the halogenated alkyl group include chloromethyl, dichloromethyl, trichloromethyl, 1-chloroethyl, 2-chloroethyl, 1,1-dichloroethyl, 1,2-dichloroethyl, 1,1,2-trichloroethyl, 1,2,2-trichloroethyl, 2,2,2-trichloroethyl, 1,1,2,2-tetrachloroethyl, 1,2,2,2-tetrachloroethyl and 1,1,2,2,2-pentachloroethyl, with trichloromethyl being particularly preferred.

If $R^1$ in the general formula (I) is an alkyl group, it desirably has no more than 5 carbon atoms. If more than 5 carbon atoms are present, the glass transition point of the polymer will decrease and it often occurs that no tack-free film is obtained (i.e., only a sticky film will result in the coating).

If $R^1$ is an alkoxy group, the starting materials and the resulting monomer will have less toxicity than when $R^1$ is an alkyl group. However, as in the case of alkyl groups, the inclusion of more than 5 carbon atoms will cause the problem of failure to obtain a tack-free film. Specific examples of the alkoxy group include methoxy, ethoxy, n-propoxy, isopropoxy, n-butoxy, t-butoxy, etc., among which methoxy and ethoxy are particularly preferred.

If $R^1$ is an aryl group, the starting materials and the resulting monomer are in solid form and hence are easy to handle. Specific examples of the aryl group include phenyl, toluyl, m-nitrophenyl, p-acetylphenyl, etc., with phenyl and toluyl being particularly preferred.

If carbon monoxide is present as $R^2$, hydrolysis due to the coordination of a hydroxyl group to the metal atom in the synthesized polymer can be prevented and this contributes to an improvement not only in the ability of the polymer to form a resist film but also in the storage stability of the resist film and the polymer itself.

Symbol M in the general formula (I) denotes Si, Ge, Sn, Ti, Mo or W, and the use of these heavy metals offers the advantage that during reactive ion etching, the reactive gas will generate an oxide or fluoride, which impart improved resistance to the dry etching. Further, in the irradiation with particularly, electron beams or X-rays, the heavy metals incorporated to the polymers will absorb higher energy than that without metals, whereby the sensitivity of the polymer as a resist material can be further enhanced.

The unit represented by the general formula (I) can be introduced by polymerization at least one monomer shown by the following general formula (IV):

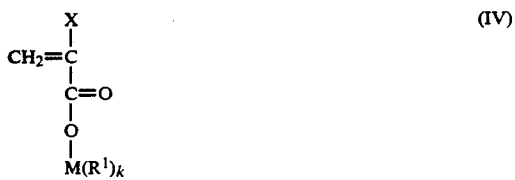

where X, $R^1$, M and k have the same meanings already defined above.

The monomer of the general formula (IV) can be synthesized by various methods and three typical methods are outlined below:

(i) reacting an α-substituted acrylic acid represented by the general formula (V):

(where X is the same as already defined above) with a metal alcohol represented by the general formula (VI):

(where $R^1$, M and k are the same as already defined above);

(ii) reacting an α-substituted acrylic acid of the general formula (V) with a metal ether represented by the general formula (VII):

(where $R^1$, M and k are the same as already defined above); or (iii) reacting an α-substituted acrylic acid of the general formula (V) with a metal chloride represented by the general formula (VIII):

(where $R^1$, M and k are the same as already defined above).

Among these, the second method which relies upon the dehydrative condensation between an α-substituted acrylic acid of the general formula (V) and a metal alcohol of the general formula (VI) is particularly required because of performining in mild reactive conditions.

Examples of the α-substituted acrylic acid represented by the general formula (V) include: methacrylic acid, α-ethylacrylic acid, α-n-propylacrylic acid, α-isopropylacrylic acid, α-t-butylacrylic acid, α-fluoroacrylic acid, α-fluoromethylacrylic acid, α-difluoromethylacrylic acid, α-trifluoromethylacrylic acid, α-1,1-difluoroethylacrylic acid, α-1,2-difluoroethylacrylic acid, α-2,2-difluoroethylacrylic acid, α-1,1,2-trifluoroethylacrylic acid, α-1,2,2-trifluoroethylacrylic acid, α-chloroacrylic acid, α-chloromethylacrylic acid, α-dichloromethylacrylic acid, α-trichloromethylacrylic acid, α-1,1-dichloroethylacrylic acid, α-1,2-dichloroethylacrylic acid, α-2,2-dichloroethylacrylic acid, α-1,1,2-trichloroethylacrylic acid, α-1,2,2-trichloroethylacrylic acid, α-bromoacrylic acid, α-bromomethylacrylic acid, α-dibromomethylacrylic acid, α-tribromomethylacrylic acid, α-1,1-dibromoethylacrylic acid, α-1,2-dibromoethylacrylic acid, α-2,2-dibromoethylacrylic acid, α-1,1,2-tribromoethylacrylic acid, α-1,2,2-tribromoethylacrylic acid, etc.

Examples of the metal alcohol represented by the general formula (VI) include: trimethylsilanol, ethyldimethylsilanol, diethylmethylsilanol, triethylsilanol, ethylmethyl(n-propyl)silanol, diethyl(n-propyl)silanol, dimethyl(n-propyl)silanol, tri(n-propyl)silanol, ethylmethyl(isopropyl)silanol, diethyl(isopropyl)silanol, dimethyl(isopropyl)silanol, tri(isopropyl)silanol, methylethyl(n-butyl)silanol, diethyl(n-butyl)silanol, dimethyl(n-butyl)silanol, tri(n-butyl)silanol, ethylmethyl(t-butyl)silanol, dimethyl(t-butyl)silanol, dimethyl(t-butyl)silanol, tri(t-butyl)silanol, ethylmethyl(n-pentyl)silanol, diethyl(n-pentyl)silanol, dimethyl(n-pentyl)silanol, tri(n-pentyl)silanol, dimethylphenylsilanol, ethylmethylphenylsilanol, diphenylmethylsilanol, diethylphenylsilanol, ethyldiphenylsilanol, phenylisopropylmethylsilanol, ethylphenylisopropylsilanol, phenyldi(isopropyl)silanol, diphenyl(isopropyl)silanol, phenylmethyl(n-propyl)silanol, ethylphenyl(n-propyl)silanol, phenyldi(n-propyl)silanol, diphenyl(n-propyl)silanol, phenylmethyl(n-butyl)silanol, ethylphenyl(n-butyl)silanol, diphenyl(n-butyl)silanol, phenyldi(t-butyl)silanol, ethylphenyl(t-butyl)silanol, phenyldi(t-butyl)silanol, phenyl(n-propyl)(t-butyl)silanol, phenylisopropyl(t-butyl)silanol, diphenyl(t-butyl)silanol, triphenylsilanol, trimethylhydroxystannane, ethyldimethylhydroxystannane, diethylmethylhydroxystannane, triethylhydroxystannane, ethylmethyl(n-propyl)hydroxystannane, diethyl(n-propyl)hydroxystannane, dimethyl(n-propyl)hydroxystannane, tri(n-propyl)hydroxystannane, ethylmethyl(isopropyl)hydroxystannane, diethyl(isopropyl)hydroxystannane, dimethyl(isopropyl)hydroxystannane, tri(isopropyl)hydroxystannane, methylethyl(n-butyl)hydroxystannane, diethyl(n-butyl)hydroxystannane, dimethyl(n-butyl)hydroxystannane, tri(n-butyl)hydroxystannane, ethylmethyl(t-butyl)hydroxystannane, diethyl(t-butyl)hydroxystannane, dimethyl(t-butyl)hydroxystannane, tri(t-butyl)hydroxystannane, ethylmethyl(n-pentyl)hydroxystannane, diethyl(n-pentyl)hydroxystannane, dimethyl(n-pentyl)hydroxystannane, tri(n-pentyl)hydroxystannane, dimethylphenylhydroxystannane, ethylmethylphenylhydroxystannane, diphenylmethylhydroxystannane, diethylphenylhydroxystannane, ethyldiphenylhydroxystannane, phenylisopropylmethylhydroxystannane, ethylphenylisopropylhydroxystannane, phenyldi(isopropyl)hydroxystannane, diphenyl(isopropyl)hydroxystannane, phenylmethyl(n-propyl)hydroxystannane, ethylphenyl(n-propyl)hydroxystannane, phenyldi(n-propyl)hydroxystannane, diphenyl(n-propyl)hydroxystannane, phenylmethyl(n-butyl)hydroxystannane, ethylphenyl(n-butyl)hydroxystannane, diphenyl(n-butyl)hydroxystannane, phenyldi(t-butyl)hydroxystannane, ethylphenyl(t-butyl)hydroxystannane, phenyldi(t-butyl)hydroxystannane, phenyl(n-propyl)(t-butyl)hydroxystannane, phenylisopropyl(t-butyl)hydroxystannane, diphenyl(t-butyl)hydroxystannane, triphenylhydroxystannane, etc.

Examples of the metal ether represented by the general formula (VII) include: hexamethyldigermoxane, diethyltetramethyldigermoxane, tetramethyldimethyldigermoxane, hexaethyldigermoxane, diethyldimethyldi(n-propyl)digermoxane, tetramethyldi(n-propyl)digermoxane, tetraethyldi(n-propyl)digermoxane, hexa(n-propyl)digermoxane, diethyldi(isopropyl)dimethyldigermoxane, di(isopropyl)tetramethyldigermoxane, tetraethyldi(isopropyl)digermoxane, hexa(isopropyl)digermoxane, diethyldimethyldi(n-butyl)digermoxane, tetramethyldi(n-butyl)digermoxane, tetraethyldi(n-butyl)digermoxane, dimethyldi(n-butyl)di(n-propyl)digermoxane, diethyldi(n-butyl)di(n-propyl)digermoxane, di(n-butyl)tetra(n-propyl)digermoxane, hexa(n-butyl)digermoxane, diisopropyldimethyldi(n-butyl)digermoxane, diethyldiisopropyldi(n-butyl)digermoxane, tetraisopropyldi(n-butyl)digermoxane, diethyldimethyldi(t-butyl)digermoxane, tetrametyldi(t-butyl)digermoxane, tetraethyldi(t-butyl)digermoxane, dimethyldi(t-butyl)di(n-propyl)digermoxane, diethyldi(t-butyl)di(n-propyl)digermoxane, di(t-butyl)tetra(n-propyl)digermoxane, hexa(t-butyl)digermoxane, diisopropyldimethyldi(t-butyl)digermoxane, diethyldiisopropyldi(t-butyl)digermoxane, tetraisopropyldi(t-butyl)digermoxane, diethyldimethyldi(n-pentyl)digermoxane, tetramethyldi(n-pentyl)digermoxane, tetraethyldi(n-pentyl)digermoxane, dimethyldi(n-pentyl)di(n-propyl)digermoxane, diethyldi(n-pentyl)di(n-propyl)digermoxane, di(n-pentyl)tetra(n-propyl)digermoxane, hexa(n-pentyl)digermoxane, diisopropyldimethyldi(n-pentyl)digermoxane, diethyldiisopropyldi(n-pentyl)digermoxane, diphenyltetramethyldigermoxane, diethyldiphenyldimethyldigermoxane, diphenyltetraethyldigermoxane, diphenyldi(isopropyl)dimethyldigermoxane, diethyldiphenyl(isopropyl)digermoxane, diphenyltetra(isopropyl)digermoxane, tetraphenyldiisopropyldigermoxane, diphenyldimethyldi(n-propyl)digermoxane, diethyldiphenyldi(n-propyl)digermoxane, diphenyltetra(n-propyl)digermoxane, diphenyldimethyldi(n-butyl)digermoxane, diphenyldiethyldi(n-butyl)digermoxane, tetra(n-butyl)diphenyldigermoxane, tetraphenyldi(n-butyl)digermoxane, diphenyldimethyldi(t-butyl)digermoxane, diethyldiphenyldi(t-butyl)digermoxane, tetraphenyldi(t-butyl)digermoxane, diphenyldi(n-propyl)di(t-butyl)digermoxane, diphenyldiisopropyldi(t-butyl)digermoxane, tetra(t-butyl)diphenyldigermoxane, hexaphenyldigermoxane, hexamethyldititanoxane, diethyltetramethyldititanoxane, tetraethyldimethyldititanoxane, hexaethyldititanoxane, diethyldimethyldi(n-propyl)dititanoxane, tetramethyldi(n-propyl)dititanoxane, tetraethyldi(n-propyl)dititanoxane, hexa(n-propyl)dititanoxane, diethyldi(isopropyl)dimethyldititanoxane, di(isopropyl)tetramethyldititanoxane, tetraethyldi(isopropyl)dititanoxane, hexa(isopropyl)dititanoxane, diethyldimethyldi(n-butyl)dititanoxane, tetramethyldi(n-butyl)dititanoxane, tetraethyldi(n-butyl)dititanoxane, dimethyldi(n-butyl)di(n-propyl)dititanoxane, diethyldi(n-butyl)di(n-propyl)dititanoxane, di(n-butyl)tetra(n-propyl)dititanoxane, hexa(n-butyl)dititanoxane, diisopropyldimethyldi(n-butyl)dititanoxane, diethyldiisopropyldi(n-butyl)dititanoxane, tetraisopropyldi(n-butyl)dititanoxane, diethyldimethyldi(t-butyl)dititanoxane, tetramethyldi(t-butyl)dititanoxane, tetraethyldi(t-butyl)dititanoxane, dimethyldi(t-butyl)di(n-propyl)dititanoxane, diethyldi(t-butyl)di(n-propyl)dititanoxane, di(t-butyl)tetra(n-propyl)dititanoxane, hexa(t-butyl)dititanoxane, diisopropyldimethyldi(t-butyl)dititanoxane, diethyldiisopropyldi(t-butyl)dititanoxane, tetraisopropyldi(t-butyl)dititanoxane, diethyldimethyldi(n-pentyl)titanoxane, tetramethyldi(n-pentyl)dititanoxane, tetraethyldi(n-pentyl)dititanoxane, dimethyldi(n-pentyl)di(n-propyl)dititanoxane, diethyldi(n-pentyl)di(n-propyl)dititanoxane, di(n-pentyl)tetra(n-propyl)dititanoxane, hexa(n-pentyl)dititanoxane, diisopropyldimethyldi(n-pentyl)dititanoxane, diethyldiisopropyldi(n-pentyl)dititanoxane, diphenyltetramethyldititanoxane, diethyldiphenyldimethyldititanoxane, diphenyltetraethyldititanoxane, diphenyldi(isopropyl)dimethyldititanoxane, diethyldiphenyldi(isopropyl)dititanoxane, diphenyltetra(isopropyl)dititanoxane, tetraphenyldiisopropyldititanoxane, diphenyldimethyldi(n-propyl)dititanoxane, diethyldiphenyldi(n-propyl)dititanoxane, diphenyltetra(n-propyl)dititanoxane, diphenyldimethyldi(n-butyl)dititanoxane, diphenyldiethyldi(n-butyl)dititanoxane, tetra(n-butyl)diphenyldititanoxane, tetraphenyldi(n-butyl)dititanoxane, diphenyldimethyldi(t-butyl)dititanoxane, diethyldiphenyldi(t-butyl)dititanoxane, tetraphenyldi(t-butyl)dititanoxane, diphenyl(n-propyl)di(t-butyl)dititanoxane, diphenyldiisopropyldi(t-butyl)dititanoxane, tetra(t-butyl)diphenyldititanoxane, hexaphenyldititanoxane, etc.

Examples of the metal chloride represented by the general formula (VIII) include: chlorotrimethylsilicon, chloroethyldimethylsilicon, chlorodiethylmethylsilicon, chlorotriethylsilicon, chloroethylmethyl(n-propyl)silicon, chlorodiethyl(n-propyl)silicon, chlorodimethyl(n-propyl)silicon, chlorotri(n-propyl)silicon, chloroethylmethyl(isopropyl)silicon, chlorodiethyl(isopropyl)silicon, chlorodimethyl(isopropyl)silicon, chlorotri(isopropyl)silicon, chloromethylethyl(n-butyl)silicon, chlorodiethyl(n-butyl)silicon, chlorodimethyl(n-butyl)silicon, chlorotri(n-butyl)silicon, chloroethylmethyl(t-butyl)silicon, chlorodiethyl(t-butyl)silicon, chlorodimethyl(t-butyl)silicon, chlorotri(t-butyl)silicon, chloroethylmethyl(n-pentyl)silicon, chlorodiethyl(n-pentyl)silicon, chlorodimethyl(n-pentyl)silicon, chlorotri(n-pentyl)silicon, chlorodimethylphenylsilicon, chloroethylmethylphenylsilicon, chlorodiphenylmethylsilicon, chlorodiethylphenylsilicon, chloroethyldiphenylsilicon, chlorophenylisopropylmethylsilicon, chloroethylphenylisopropylsilicon, chlorophenyldi(isopropyl)silicon, chlorodiphenyl(isopropyl)silicon, chlorophenylmethyl(n-propyl)silicon, chloroethylphenyl(n-propyl)silicon, chlorophenyldi(n-propyl)silicon, chlorodiphenyl(n-propyl)silicon, chlorophenylmethyl(n-butyl)silicon, chloroethylphenyl(n-butyl)silicon, chlorodiphenyl(n-butyl)silicon, chlorophenyldi(t-butyl)silicon, chloroethylphenyl(t-butyl)silicon, chlorophenyldi(t-butyl)silicon, chlorophenyl(n-propyl)(t-butyl)silicon, chlorophenylisopropyl(t-butyl)silicon, chlorodiphenyl(t-butyl)silicon, chlorotriphenylsilicon, chlorotrimethylstannane, chloroethyldimethylstannane, chlorodiethylmethylstannane, chlorotriethylstannane, chloroethylmethyl(n-propyl)stannane, chlorodiethyl(n- propyl)stannane, chlorodimethyl(n-propyl)stannane, chlorotri(n-propyl)stannane, chloroethylmethyl(isopropyl)stannane, chlorodiethyl(isopropyl)stannane, chlorodimethyl(isopropyl)stannane, chlorotri(isopropyl)stannane, chloromethylethyl(n-butyl)stannane, chlorodiethyl(n-butyl)stannane, chlorodimethyl(n-butyl)stannane, chlorotri(n-butyl)stannane, chloroethylmethyl(t-butyl)stannane, chlorodiethyl(t-butyl)stannane, chlorodimethyl(t-butyl)stannane, chlorotri(n-butyl)stannane, chloroethylmethyl(n-pentyl)stannane, chlorochloroethyl(n-pentyl)stannane, chlorodimethyl(n-pentyl)stannane, chlorotri(n-pentyl)stannane, chlorodimethylphenylstannane, chloroethylmethylphenylstannane, chlorodiphenylmethylstannane, chlorodiethylphenylstannane, chloroethyldiphenylstannane, chlorophenylisopropylmethylstannane, chloroethylphenylisopropylstannane, chlorophenyldi(isopropyl)stannane, chlorodiphenyl(isopropyl)stannane, chlorophenylmethyl(n-propyl)stannane, chloroethylphenyl(n-propyl)stannane, chlorophenyldi(n-propyl)stannane, chlorodiphenyl(n-propyl)stannane, chlorophenylmethyl(n-butyl)stannane, chloroethylphenyl(n-butyl)stannane, chlorodiphenyl(n-butyl)stannane, chlorophenyldi(t-butyl)stannane, chloroethylphenyl(t-butyl)stannane, chlorophenyldi(t-butyl)stannane, chlorophenyl(n-propyl)(t-butyl)stannane, chlorophenylisopropyl(t-butyl)stannane, chlorodiphenyl(t-butyl)stannane, chlorotriphenylstannane, dicarbonylchlorotropylium molybdenum, chlorotricarbonyl($\eta^5$-cyclopentanedienyl)molybdenum, dicarbonylchlorotropylium tungsten, chlorotricarbonyl($\eta^5$-cyclopentadienyl)tungsten, carbonylchlorobis($\eta^5$-2,4-cyclopentadiene-1-el)titanium, etc.

The radiation-sensitive polymer of the present invention may be composed solely of the unit represented by the general formula (I). If it is desired to control the metal content in the polymer, to solidify the product (obtain it as a powder) by increasing the Tg of the polymer, to achieve a higher yield and even to improve the film-forming property, the polymer may further contain a unit represented by the general formula (II):

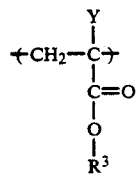

(II)

(where Y is an alkyl group, a halogen atom or a halogenated alkyl group; $R^3$ is an alkyl group or an aryl group). The polymer of the present invention may contain two or more units (II) having different Y and $R^3$. If the polymer has a higher glass transition point (Tg) and hence can be easily obtained in solid form, not only it is easy to formulate the polymer as a resist material but also to obtain a tack-free polymer film.

Specific examples of Y in the general formula (II) may be the same as those given for the alkyl group, halogen atom and halogenated alkyl group represented by X in the general formula (I). Such examples will provide the same effect as when X in the general formula (I) is an alkyl group, a halogen atom or a halogenated alkyl group.

Specific examples of $R^3$ in the general formula (II) may be the same as those given for the alkyl or aryl group represented by $R^1$ in the general formula (I), or they include, such as, n-pentyl, isopentyl, neopentyl, n-hexyl, isohexyl, heptyl, octyl, nonyl and decanyl. These examples will provide the same effect as when $R^1$ in the general formula (I) is an alkyl or aryl group. If $R^3$ is an alkyl group, it preferably has no more than 10 carbon atoms.

The unit represented by the general formula (II) can be introduced into the polymer by the copolymerizing a monomer of the general formula (IX):

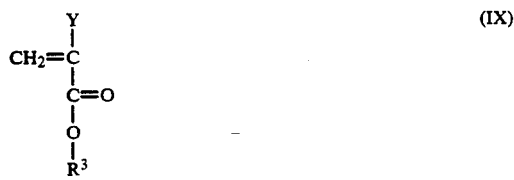

(IX)

(where $R^3$ and Y are the same as already defined above) with the monomer of the general formula (IV).

Specific examples of the monomer represented by the general formula (IX) include: methyl methacrylate, methyl α-ethylacrylate, methyl α-n-propylacrylate, methyl α-isopropylacrylate, methyl α-t-butylacrylate, methyl α-fluoroacrylate, methyl α-fluoromethylacrylate, methyl α-difluoromethylacrylate, methyl α-trifluoromethylacrylate, methyl α-1,1-difluoroethylacrylate, methyl α-1,2-difluoroethylacrylate, methyl α-2,2-difluoroethylacrylate, methyl α-1,1,2-trifluoroethylacrylate, methyl α-1,2,2-trifluoroethylacrylate, methyl α-chloroacrylate, methyl α-chloromethylacrylate, methyl α-dichloromethylacrylate, methyl α-trichloromethylacrylate, methyl α-1,1-dichloroethylacrylate, methyl α-1,2-dichloroethylacrylate, methyl α-2,2-dichloroethylacrylate, methyl α-1,1,2-trichloroethylacrylate, methyl α-1,2,2-trichloroethylacrylate, methyl α-bromoacrylate, methyl α-bromomethylacrylate, methyl α-dibromomethylacrylate, methyl α-tribromomethylacrylate, methyl α-1,1-dibromoethylacrylate, methyl α-1,2-dibromoethylacrylate, methyl α-2,2-dibromoethylacrylate, methyl α-1,1,2-tribromoethylacrylate, methyl α-1,2,2-tribromoethylacrylate, ethyl methacrylate, ethyl α-ethylacrylate, ethyl α-n-propylacrylate, ethyl α-isopropylacrylate, ethyl α-t-butylacrylate, ethyl α-fluoroacrylate, ethyl α-fluoromethylacrylate, ethyl α-difluoromethylacrylate, ethyl α-trifluoromethylacrylate, ethyl α-1,1-difluoroethylacrylate, ethyl α-1,2-difluoroethylacrylate, ethyl α-2,2-difluoroethylacrylate, ethyl α-1,2-trifluoroethylacrylate, ethyl α-1,2,2-trifluoroethylacrylata, ethyl α-chloroacrylate, ethyl α-chloromethylacrylate, ethyl α-dichloromethylacrylate, ethyl α-trichloromethylacrylate, ethyl α-1,1-dichloroethylacrylate, ethyl α-1,2-dichloroethylacrylate, ethyl α-2,2-dichloroethylacrylate, ethyl α-1,1,2-trichloroethylacrylate, ethyl α-1,2,2-trichloroethylacrylate, ethyl α-bromoacrylate, ethyl α-bromomethylacrylate, ethyl α-dibromomethylacrylate, ethyl α-tribromomethylacrylate, ethyl α-1,1-dibromoethylacrylate, ethyl α-1,2-dibromoethylacrylate, ethyl α-2,2-dibromoethylacrylate, ethyl α-1,1,2-tribromoethylacrylate, isopropyl methacrylate, isopropyl α-ethylacrylate, isopropyl α-n-propylacrylate, isopropyl α-isopropylacrylate, isopropyl α-t-butylacrylate, isopropyl α-fluoroacrylate, isopropyl α-fluoromethylacrylate, isopropyl α-difluoromethylacrylate, isopropyl α-trifluoromethylacrylate, isopropyl α-1,1-difluoroethylacrylate, isopropyl α-1,2-difluoroethylacrylate, isopropyl α-2,2-difluoroethylacrylate, isopropyl α-1,1,2- trifluoroethylacrylate, isopropyl α-1,2,2-trifluoroethylacrylate, isopropyl α-chloroacrylate, isopropyl α-chloromethylacrylate, isopropyl α-dichloromethylacrylate, isopropyl α-trichloromethylacrylate, isopropyl α-1,1-dichloroethylacrylate, isopropyl α-1,2-dichloroethylacrylate, isopropyl α-2,2-dichloroethylacrylate, isopropyl α-1,1,2-trichloroethylacrylate, isopropyl α-1,2,2-trichloroethylacrylate, isopropyl α-bromoacrylate, isopropyl α-bromomethylacrylate, isopropyl α-dibromomethylacrylate, isopropyl α-tribromomethylacrylate, isopropyl α-1,1-dibromoethylacrylate, isopropyl α-1,2-dibromoethylacrylate, isopropyl α-2,2-dibromoethylacrylate, isopropyl α-1,1,2-tribromoethylacrylate, isopropyl α-1,2,2-tribromoethylacrylate, n-butyl α-1,2,2-tribromoethylacrylate, n-butyl methacrylate, n-butyl α-ethylacrylate, n-butyl α-n-propylacrylate, n-butyl α-isopropylacrylate, n-butyl α-t-butylacrylate, n-butyl α-fluoroacrylate, n-butyl α-fluoromethylacrylate, n-butyl α-difluoromethylacrylate, n-butyl α-trifluoromethylacrylate, n-butyl α-1,1-difluoroethylacrylate, n-butyl α-1,2-difluoroethylacrylate, n-butyl α-2,2-difluoroethylacrylate, n-butyl α-1,1,2-trifluoroethylacrylate, n-butyl α-1,2,2-trifluoroethylacrylate, n-butyl α-chloroacrylate, n-butyl α-chloromethylacrylate, n-butyl α-dichloromethylacrylate, n-butyl α-trichloromethylacrylate, n-butyl α-1,1-dichloroethylacrylate, n-butyl α-1,2-dichloroethylacrylate, n-butyl α-2,2-dichroroethylacrylate, n-butyl α-1,1,2-trichloroethylacrylate, n-butyl α-1,2,2-trichloroethylacrylate, n-butyl α-bromoacrylate, n-butyl α-bromomethylacrylate, n-butyl α-dibromomethylacrylate, n-butyl α-tribromomethylacrylate, n-butyl α-1,1-dibromoethylacrylate, n-butyl α-1,2-dibromoethylacrylate, n-butyl α-2,2-dibromoethylacrylate, n-butyl α-1,1,2-tribromoethylacrylate, n-butyl α-1,2,2-tribromoethylacrylate, phenyl α-1,2,2-tribromoethylacrylate, phenyl methacrylate, phenyl α-ethylacrylate, phenyl α-n-propylacrylate, phenyl α-isopropylacrylate, phenyl α-t-butylacrylate, phenyl α-fluoroacrylate, phenyl α-fluoromethylacrylate, phenyl α-difluoromethylacrylate, phenyl α-trifluoromethylacrylate, phenyl α-1,1-difluoroethylacrylate, phenyl α-1,2-difluoroethylacrylate, phenyl α-2,2-difluoroethylacrylate, phenyl α-1,1,2-trifluoroethylacrylate, phenyl α-1,2,2-trifluoroethylacrylate, phenyl α-chloroacrylate, phenyl α-chloromethylacrylate, phenyl α-dichloromethylacrylate, phenyl α-trichloromethylacrylate, phenyl α-1,1-dichloroethylacrylate, phenyl α-1,2-dichloroethylacrylate, phenyl α-2,2-dichloroethylacrylate, phenyl α-1,1,2-trichloroethylacrylate, phenyl α-1,2,2-trichloroethylacrylate, phenyl α-bromoacrylate, phenyl α-bromomethylacrylate, phenyl α-dibromomethylacrylate, phenyl α-tribromomethylacrylate, phenyl α-1,1-dibromoethylacrylate, phenyl α-1,2-dibromoethylacrylate, phenyl α-2,2-dibromoethylacrylate, phenyl α-1,1,2-tribromoethylacrylate, phenyl α-1,2,2-tribromoethylacrylate, etc.

In order to increase its glass transition point (Tg) and to provide improved sensitivity due to the radiation chemical reaction of a sulfonyl group, the radiation-sensitive polymer of the present invention may also contain a unit represented by the general formula (III):

   (III)

where $R^4$ is a divalent alkyl or aryl group. The polymer may contain two or more units (III) having different $R^4$.

If $R^4$ in the general formula (III) is a divalent alkyl group, it may be exemplified by methylene, ethylene, n-propylene, n-butylene, t-butylene, etc. In the presence of no more than 10 carbon atoms, the radiation chemical reaction of the sulfonyl group will readily occur to provide improved sensitivity.

If $R^4$ is a divalent aryl group, it may be exemplified by o-phenylene, p-phenylene, 1,3-o-toluylene, 1,4-o-toluylene, 1,5-m-toluylene, 1,3-o-nitrobenzylylene, etc. The unit (III) containing at least one of these aryl groups will provide improved resistance to the dry etching.

The unit represented by the general formula (III) can be introduced in the polymer of the present invention by copolymerizing a monomer of the general formula (X):

   (X)

(where $R^5$ is an alkene or arylene group having a double bond; and Z is a hydrogen atom or a halogen atom) together with monomers of the general formulas (IV) and (IX).

Specific examples of the monomer represented by the general formula (X) include: ethylenesulfinic acid, isopropylenesulfinic acid, n-butylenesulfinic acid, phenylenesulfinic acid, ethylenesulfonyl chloride, ethylenesulfonyl bromide, ethylenesulfonyl iodide, isopropylenesulfonyl chloride, isopropylenesulfonyl bromide, isopropylenesulfonyl iodide, n-butylenesulfonyl chloride, n-butylenesulfonyl bromide, n-butylenesulfonyl iodide, phenylenesulfonyl chloride, phenylenesulfonyl bromide, phenylenesulfonyl iodide, o-nitrobenzylylenesulfonyl chloride, m-nitrobenzylylenesulfonyl chloride, etc.

In order to provide improved radiation sensitivity and dry etching resistance and from the viewpoint of microfabrication, the unit represented by the general formula (I) is preferably contained in an amount of at least 2%, more preferably at least 4.5%.

If the radiation-sensitive polymer of the present invention contains the unit of the general formula (II), the ratio of the unit (I) to (II) is preferably from 1:0.5 to 1:45, more preferably in the range of from 1:8 to 1:45. If the ratio of (I) to (II) is less than 1:45, the metal content of the polymer is insufficient to provide improved resistance to dry etching, which is one of the objects of the present invention. If the ratio of (I) to (II) exceeds 1:0.5, the polymer will have too low a glass transition point to solidify efficiently. Further, not only does it become difficult to formulate the polymer as a resist material but also the polymer film will not become sufficiently tack-free.

If the polymer of the present invention contains the unit of the general formula (III), the ratio of the unit (I) to (III) is preferably from 1:0.5 to 1:20, more preferably in the range of from 1:1 to 1:15. If the ratio of (I) to (III) is less than 1:20, the metal content of the polymer is insufficient to provide improved sensitivity which is another object of the present invention. If the ratio of (I) to (III) exceeds 1:0.5, the polymer will have too low a glass transition point to solidify efficiently. Further, not only does it become difficult to formulate the polymer as a resist material but also the polymer will not become sufficiently tack-free.

There is no particular limitation on the method for producing the radiation-sensitive polymer of the present invention which contains the unit of the general formula (I) and, optionally, the units (II) and/or (III). According to one method, a monomer represented by the general formula (IV) and, if necessary, monomers represented by the general formulas (IX) and/or (X), are dissolved in an organic solvent such as xylene; part of a polymerization initiator dissolved in the same solvent is added to start the reaction; thereafter, the reaction is carried out with heating while the remaining initiator is added dropwise. The polymer produced can be recovered by re-precipitation.

Different polymerization initiators should be used depending upon the polymerization to be carried out: in radical polymerization, benzoyl peroxide, azobisisobutyronitrile, hydrogen peroxide-iron (II) ion, persulfate ion-iron (II) ion, etc. may be used; in cationic polymerization, proton acids (e.g. hydrochloric acid and sulfuric acid), Lewis acids (e.g. boron trifluoride), organometallic compounds (e.g. alkylaluminum chlorides), etc. may be used; in anionic polymerization, alkyl metals (e.g. dimethyl strontium and methyl potassium) and compounds that generate alkali metals such as sodium and lithium may be used. Reaction with benzoyl peroxide in radical polymerization is particularly desirable since it enables the production of a long-chain polymer.

A polymer containing the unit of the general formula (III) may be produced by the following procedure: mixing a compound of the general formula (V), a compound of the general formula (VI), (VII) or (VIII) and, optionally, a monomer of the general formula (IX) in a solvent such as benzene in an ampule; solidifying the mixture at the temperature of liquid nitrogen; introducing $SO_2$ gas into the ampule; sealing it; and carrying out the polymerization reaction with heating. The resulting polymer can be isolated by reprecipitation.

From the viewpoints of sensitivity, resolution and film-forming property as a resist material, the thus produced radiation-sensitive polymer of the present invention preferably has an average molecular weight of about 20,000-500,000. Such polymers may be used either individually or as admixtures.

The radiation-sensitive composition of the present invention comprises the above-described radiation-sensitive polymer, a compound that generates an acid in response to radiations, and/or a compound that provides enhanced radiation sensitivity.

If a compound that generates an acid in response to radiations is added to the radiation-sensitive polymer, the radiation chemical reaction of the polymer is accelerated by the acid compared to the case without that one, and this contributes to marked improvement on the radiation sensitivity of the composition.

Illustrative compound that generates an acid owing to the reaction by irradiations are salts of iodonium, sulfonium, phosphonium, bromonium, chloronium, oxysulfoxonium, oxosulfonium, sulfoxonium, selenium, telluronium and arsonium, and may be exemplified by the following: triphenylsulfonium tetrafluoroborate, triphenylsulfonium hexafluoroantimonate, triphenylsulfonium hexafluoroarsinate, triphenylsulfonium hexafluorophosphate, triphenylsulfonium trifluorosulfonate, diphenyliodonium hexafluoroantimonate, diphenyliodonium hexafluoroantimonate, diphenyliodonium hexafluoroarsinate, diphenyliodonium hexafluorophosphate, 2,4,6-tris(trichloromethyl)triazine, 2-allyl-4,6-bis(trichloromethyl)triazine, α,α,α-tribromomethylphenylsulfone, α,α,α,α',α'-hexachloroxylylene, 2nitrobenzyl ester of methylsulfonic acid, 2-nitrobenzyl ester of acetic acid, etc. These compounds may be used either alone or as admixtures.

The compounds that generate an acid in response to radiations are preferably added in amounts of 0.1-30 wt % (all percentages are hereinafter on a weight basis) of the composition, with the range of 3-15% being more preferred. If these compounds are added in an amount less than 0.1% of the polymer, the advantage described above will not be fully attained. If their content exceeds 30%, the resulting composition will have only limited solubility in solvents.

If the compound that provides enhanced radiation sensitivity is added to the radiation-sensitive polymer, the radiation chemical reaction of the polymer is accelerated compared to the case where the polymer alone is used, and this also contributes to improvement in the radiation sensitivity of the composition.

Illustrative compounds that provide enhanced radiation sensitivity are polynuclear aromatic compounds having at least one substituent in the class consisting of an amino group, a hydroxyl group, an alkoxy group and an acetamido group, and they may be exemplified by the following: 4-methoxynaphthalene, 1,4-dicyanonaphthalene, 9-cyanophenanthrene, phenanthren-9-acetamide, 9-aminophenanthrene, 9-methoxyphenanthrene, 1-aminoanthracene, 2-aminoanthracene, 9-cyanoanthracene, 9,10-dicyanoanthracene, 2,6,9,10-tetracyanoanthracene, 1-methoxyperylene, 1-cyanoperylene, 1-acetamidoperylene, 1,7-dicyanoperylene, 2,8-dicyanoperylene, 2,8-dimethoxyperylene, 1,7-dihydroxyperylene, 2-acetamidofluorene, chrysoidine, 1,7-dicyanochrysene, 1,7-hydroxychrysene, 2,8-diaminoperylene, etc.

These compounds for providing enhanced radiation sensitivity are preferably added in amounts of 0.1-20%, more preferably 1-10%, of the composition. If their amount is less than 0.1% of the polymer, the desired effect will not be exhibited to the fullest extent. If their amount exceeds 20%, the resulting composition will have only limited solubility in solvents.

The radiation-sensitive polymer of the present invention has not only high radiation sensitivity and resolution but also sufficiently high dry etching resistance to form a thin film by a simple coating technique. Thus, this polymer is suitable for use as a single-layered resist material. The polymer of the present invention is prepared by polymerizing the monomer unit of the general formula (I) from a precursor having an alkyl metal group introduced therein which provides a basis for dry etching resistance. If this monomer unit is copolymerized with the monomer unit of the general formula (II), the metal content, and hence the dry etching resistance, of the resulting polymer (copolymer) can be freely controlled. As a result, the problems that would otherwise occur such as the immiscibility of blend systems can be solved.

The radiation-sensitive composition of the present invention is characterized by having the sensitivity of the polymer further improved by incorporating the specified compound(s), and it enables patterning to be carried out in high resolution and high aspect ratio. The composition also has high resistance to dry etching, so it enables pattern transfer to be carried out easily by etching substrates such as inorganic oxide films. Further, this composition is capable of forming a thin film by a simple coating technique.

The composition of the present invention may be a three-component resist material consisting of the polymer, the compound that generates an acid in response to radiations, and the compound that provides enhanced radiation sensitivity. The sensitivity of this three-component resist material is comparable to or higher than that of the two-component system containing either one of the compounds described above.

Needless to say, the radiation-sensitive polymer and composition of the present invention can also be applied as a multi-layered resist material since they have high resistance to the dry etching whether it is performed with the oxygen or the carbon halide gas plasma.

The radiation-sensitive polymer and composition of the present invention may contain an adhesion improving agent or other suitable additives as required.

Solvents that can be used when the radiation-sensitive polymer and composition of the present invention are applied as resist materials include methyl ethyl ketone, chlorobenzene, methyl cellosolve acetate, ethyl cellosolve acetate, ethyl acetate, butyl acetate, diethylene glycol dimethyl ether, cyclohexanone, etc. For exposure, high-energy radiations are used and they include ultraviolet light, deep-ultraviolet light, electron beams, X-rays, etc. Suitable liquid developers include a mixture of methanol and isoamyl acetate, a mixture of methanol, methyl isobutyl ketone and isoamyl acetate, an aqueous solution of tetramethyl ammonium hydride, water, etc.

The following examples are provided for the purpose of further illustrating the present invention but are in no way to be taken as limiting.

EXAMPLE 1

Methacrylic acid (0.1 mol) and tri-n-butylhydroxystannane (0.1 mol) were dissolved in xylene and subjected to reaction. The water that formed as the reaction proceeded was removed together with the solvent by distillation. The by-product of the reaction was distilled off under vacuum and the residue was dried under vacuum to obtain tri-n-butylstannyl methacrylate (m.p. 46° C.; yield, 64%). This tri-n-butylstannyl methacrylate was put into a round-bottom flask and xylene was added to attain a concentration of ca. 50%. As a polymerization initiator, benzoyl peroxide (1 mol % of)the tri-n-butylstannyl methacrylate) dissolved in xylene was charged into a dropping funnel. After equipping the flask with this funnel, the benzoyl peroxide solution was dripped in an amount of about 10% of the total quantity. Thereafter, the flask was heated to the reflux temperature and the remaining initiator was slowly added dropwise until the reaction was completed in 8 hours. After the reaction, the content of the flask was added to n-hexane and subjected to re-precipitation. The resulting precipitate was recovered and dried to obtain poly(tri-n-butylstannyl methacrylate). Yield, 80%, Mn, 30,000; Mw/Mn=1.8, IR ($\nu^{-1}$), 1700, 1160, 700; atomic absorption spectrum (Sn content), 31.44 (found) and 31.64 (calculated).

EXAMPLE 2

The polymer prepared in Example 1 was dissolved in methyl ethyl ketone (hereinafter abbreviated as MEK) to form a 10% solution. This solution was spin-coated onto an Si wafer having a flat layer made of silicon oxide (the rotational speed was changed in two stages, 850 rpm in the first stage, and 1,500 rpm in the second stage) and prebaked for 30 minutes in a convection oven at 80° C. to form a film 1 μm thick. Thereafter, exposure to electron beams was carried out with an electron beam exposure apparatus (ELS-3300 of Elionics, Inc.) having an acceleration voltage of 20 keV. When development was subsequently performed for 1 minute with a 1:8 (v/v) liquid mixture of methanol and isoamyl acetate (hereinafter abbreviated as MBA), a positive fineline pattern (0.2 μm lines and spaces, which is hereinafter abbreviated as L/S) was obtained. The sensitivity was 13.5 $\mu C/cm^2$ and there was no loss of the film in the unexposed areas.

EXAMPLE 3

The wafer patterned in Example 2 was set in a dry etching apparatus (DEM-451T of Nippon Electric Anerva Co., Ltd.) and the flat layer was dry-etched with an oxygen plasma at an $O_2$ pressure of 13 Pa and an RF output of 60 W. The etching speed was 50 Å/min.

EXAMPLE 4

To the polymer prepared in Example 1, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 8.0 $\mu C/cm^2$ and there was no loss of the film in the unexposed areas.

EXAMPLE 5

The flat layer on the wafer patterned in Example 4 was dry-etched with an oxygen plasma under the same conditions as in Example 3. The etching speed was 50 Å/min.

EXAMPLE 6

To the polymer prepared in Example 1, 9-cyanoanthracene was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.0 $\mu C/cm^2$ and there was no loss of the film in the unexposed areas.

EXAMPLE 7

The flat layer on the wafer patterned in Example 6 was dry-etched with an oxygen plasma under the same conditions as in Example 3. The etching speed was 50 Å/min.

EXAMPLE 8

To the polymer prepared in Example 1, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 3.0 $\mu C/cm^2$ and there was no loss of the film in the unexposed areas.

EXAMPLE 9

The flat layer on the wafer patterned in Example 8 was dry-etched with an oxygen plasma under the same conditions as in Example 3. The etching speed was 50 Å/min.

EXAMPLE 10

Methacrylic acid (0.1 mol) and tri-n-butylhydroxystannane (0.1 mol) were dissolved in xylene and subjected to reaction. The water that formed as the reaction proceeded was removed together with the solvent by distillation. The by-product of the reaction was distilled off under vacuum and the residue was dried under vacuum to obtain tri-n-butylstannyl methacrylate (m.p. 46° C.; yield, 64%). This tri-n-butylstannyl methacrylate and ethyl methacrylate were put into a round-bottom flask at a molar ratio of 1:1 and xylene was added to achieve a concentration of ca. 50%. Benzoyl peroxide (1 mol % of the sum of tri-n-butylstannyl methacrylate and ethyl methacrylate) dissolved in xylene was charged into a dropping funnel. After equipping the flask with this funnel, the benzoyl peroxide solution was dripped in an amount of about 10% of the total quantity of the solution. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain a solid product, which was slowly added to ice water and reprecipitated. The precipitate was recovered and dried to obtain poly(tri-n-butylstannyl methacrylate-ethyl methacrylate). Yield, 80%, Mn, 48,000; Mw/Mn=1.9, IR ($\nu$ cm$^{-1}$), 1720, 1160, 760, 700; atomic absorption spectrum (Sn content), 24.90 (found) and 24.98 (calculated).

EXAMPLE 11

The polymer prepared in Example 10 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 $\mu$m L/S) was obtained. The sensitivity was 13.0 $\mu$C/cm$^2$ and there was no loss of the film in the unexposed areas.

EXAMPLE 12

The flat layer on the wafer patterned in Example 11 was dry-etched with an oxygen plasma under the same conditions as in Example 3. The etching speed was 57 Å/min.

EXAMPLE 13

To the polymer prepared in Example 10, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 $\mu$m L/S) was obtained. The sensitivity was 13.0 $\mu$C/cm$^2$ and there was no loss of the film in the unexposed areas.

EXAMPLE 14

The flat layer on the wafer patterned in Example 13 was dry-etched with an oxygen plasma under the same conditions as in Example 3. The etching speed was 57 Å/min.

EXAMPLE 15

To the polymer prepared in Example 10, 9-cyanoanthracene was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 $\mu$m L/S) was obtained. The sensitivity was 13.0 $\mu$C/cm$^2$ and there was no loss of the film in the unexposed areas.

EXAMPLE 16

The flat layer on the wafer patterned in Example 15 was dry-etched with an oxygen plasma under the same conditions as in Example 3. The etching speed was 57 Å/min.

EXAMPLE 17

To the polymer prepared in Example 10, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 $\mu$m L/S) was obtained. The sensitivity was 10.0 $\mu$C/cm$^2$ and there was no loss of the film in the unexposed areas.

EXAMPLE 18

The flat layer on the wafer patterned in Example 17 was dry-etched with an oxygen plasma under the same conditions as in Example 3. The etching speed was 57 Å/min.

EXAMPLE 19

Methacrylic acid (0.1 mol) and hexaethyldigermoxane (0.05 mol) were dissolved in xylene and subjected to reaction. The water that formed as the reaction proceeded was removed with the solvent by distillation. The by-product of the reaction was distilled off under vacuum and the residue was dried under vacuum to obtain triethylgermane methacrylate (m.p. 78° C.; yield, 70%). This triethylgermane methacrylate was put into a round-bottom flask and xylene was added to achieve a concentration of ca. 50%. Benzoyl peroxide (1 mol % of the triethylgermane methacrylate) dissolved in xylene was charged into a dropping funnel. After equipping the flask with this funnel, the benzoyl peroxide solution was dripped in an amount of about 10% of the total quantity. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain poly(triethylgermane methacrylate). Yield, 76%, Mn, 42,000; Mw/Mn=2.0, IR ($\nu$ cm$^{-1}$), 1700, 1135, 710; atomic absorption spectrum (Sn content), 29.50 (found) and 29.65 (calculated).

EXAMPLE 20

The polymer prepared in Example 19 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 15.2 μC/cm$^2$ and there was no loss of the film in the unexposed areas.

EXAMPLE 21

The flat layer on the wafer patterned in Example 20 was dry-etched with an oxygen plasma under the same conditions as in Example 3. The etching speed was 60 Å/min.

EXAMPLE 22

To the polymer prepared in Example 19, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 9.5 μC/cm$^2$ and there was no loss of the film in the unexposed areas.

EXAMPLE 23

The flat layer on the wafer patterned in Example 22 was dry-etched with an oxygen plasma under the same conditions as in Example 3. The etching speed was 60 Å/min.

EXAMPLE 24

To the polymer prepared in Example 19, 9-cyanoanthracene was added in an amount of 3% of the polymer and an MEK solution having an overall concentration of 10% was formed. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 7.5 μC/cm$^2$ and there was no loss of the film in the unexposed areas.

EXAMPLE 25

The flat layer on the wafer patterned in Example 24 was dry-etched with an oxygen plasma under the same conditions as in Example 3. The etching speed was 60 Å/min.

EXAMPLE 26

To the polymer prepared in Example 19, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.0 μC/cm$^2$ and there was no loss of the film in the unexposed areas.

EXAMPLE 27

The flat layer on the wafer patterned in Example 26 was dry-etched with an oxygen plasma under the same conditions as in Example 3. The etching speed was 60 Å/min.

EXAMPLE 28

Methacrylic acid (0.1 mol) and hexaethyldigermoxane (0.05 mol) were dissolved in xylene and subjected to reaction. The water that formed as the reaction proceeded was removed with the solvent by distillation. The by-product of the reaction was distilled off under vacuum and the residue was dried under vacuum to obtain triethylgermane methacrylate (m.p. 78° C.; yield, 70%). This triethylgermane methacrylate and methyl methacrylate were put into a round-bottom flask at a molar ratio of 1:1 and xylene was added to achieve a concentration of ca. 50%. Benzoyl peroxide (1 mol % of the sum of the triethylgermane methacrylate and methyl methacrylate) dissolved in xylene was charged into a dropping funnel. After equipping the flask with this funnel, the benzoyl peroxide solution was dripped in an amount of about 10% of the total quantity of the solution. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain a solid product, which was slowly added to ice water and re-precipitated. The precipitate was recovered and dried to obtain poly(triethylgermane methacrylate-methyl methacrylate). Yield, 82%, Mn, 50,000; Mw/Mn=2.0, IR ($\nu$ cm$^{-1}$), 1720, 1135, 760, 710; atomic absorption spectrum (Ge content), 21.00 (found) and 21.05 (calculated).

EXAMPLE 29

The polymer prepared in Example 28 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 15.0 μC/cm$^2$ and there was no loss of the film in the unexposed areas.

EXAMPLE 30

The flat layer on the wafer patterned in Example 29 was dry-etched with an oxygen plasma under the same conditions as in Example 3. The etching speed was 63 Å/min.

EXAMPLE 31

To the polymer prepared in Example 28, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 8.5 μC/cm² and there was no loss of the film in the unexposed areas.

EXAMPLE 32

The flat layer on the wafer patterned in Example 31 was dry-etched with an oxygen plasma under the same conditions as in Example 3. The etching speed was 63 Å/min.

EXAMPLE 33

To the polymer prepared in Example 28, 9-cyanoanthracene was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.0 μC/cm² and there was no loss of the film in the unexposed areas.

EXAMPLE 34

The flat layer on the wafer patterned in Example 33 was dry-etched with an oxygen plasma under the same conditions as in Example 3. The etching speed was 63 Å/min.

EXAMPLE 35

To the polymer prepared in Example 28, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 2.5 μC/cm² and there was no loss of the film in the unexposed areas.

EXAMPLE 36

The flat layer on the wafer patterned in Example 35 was dry-etched with an oxygen plasma under the same conditions as in Example 3. The etching speed was 63 Å/min.

EXAMPLE 37

Methacrylic acid (0.1 mol) and hexaethyldititanoxane (0.05 mol) were dissolved in xylene and subjected to reaction. The water that formed as the reaction proceeded was removed together with the solvent by distillation. The by-product of the reaction was distilled off under vacuum and the residue was dried under vacuum to obtain triethyltitanyl methacrylate (m.p. 89° C.; yield, 54%). This triethyltitanyl methacrylate was put into a round-bottom flask and xylene was added to achieve a concentration of ca. 50%. As a polymerization initiator, benzoyl peroxide (1 mol% of the triethyltitanyl methacrylate) dissolved in xylene was charged into a dropping funnel. After equipping the flask with this funnel, the benzoyl peroxide solution was dripped in an amount of about 10% of the total quantity. Thereafter, the flask was heated to the reflux temperature and the initiator was slowly added dropwise until the reaction was completed in 8 hours. After the reaction, the content of the flask was added to n-hexane and subjected to re-precipitation. The resulting precipitate was recovered and dried to obtain poly(triethyltitanyl methacrylate). Yield, 70%, Mn, 32,000; Mw/Mn=1.9, IR (ν cm$^{-1}$), 1710, 1100, 720; atomic absorption spectrum (Ti content), 21.60 (found) and 21.75 (calculated).

EXAMPLE 38

The polymer prepared in Example 37 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 15.3 μC/cm² and there was no loss of the film in the unexposed areas.

EXAMPLE 39

The flat layer on the wafer patterned in Example 38 was dry-etched with an oxygen plasma under the same conditions as in Example 3. The etching speed was 60 Å/min.

EXAMPLE 40

To the polymer prepared in Example 37, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 8.2 μC/cm² and there was no loss of the film in the unexposed areas.

EXAMPLE 41

The flat layer on the wafer patterned in Example 40 was dry-etched with an oxygen plasma under the same conditions as in Example 3. The etching speed was 60 Å/min.

EXAMPLE 42

To the polymer prepared in Example 37, 9-cyanoanthracene was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 8.2 μC/cm² and there was no loss of the film in the unexposed areas.

EXAMPLE 43

The flat layer on the wafer patterned in Example 42 was dry-etched with an oxygen plasma under the same conditions as in Example 3. The etching speed was 60 Å/min.

EXAMPLE 44

To the polymer prepared in Example 37, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.2 μC/cm² and there was no loss of the film in the unexposed areas.

EXAMPLE 45

The flat layer on the wafer patterned in Example 44 was dry-etched with an oxygen plasma under the same conditions as in Example 3. The etching speed was 60 Å/min.

EXAMPLE 46

Methacrylic acid (0.1 mol) and hexaethyldititanoxane (0.05 mol) were dissolved in xylene and subjected to reaction. The water that formed as the reaction proceeded was removed together with the solvent by distillation. The by-product of the reaction was distilled off under vacuum and the residue was dried under vacuum to obtain triethyltitanyl methacrylate (m.p. 89° C.; yield, 54%). This triethyltitanyl methacrylate and methyl methacrylate were put into a round-bottom flask at a molar ratio of 1:1 and xylene was added to achieve a concentration of ca. 50%. Benzoyl peroxide (1 mol % of the sum of the triethyltitanyl methacrylate and methyl methacrylate) dissolved in xylene was charged into a dropping funnel. After equipping the flask with this funnel, the benzoyl peroxide solution was dripped in an amount of about 10% of the total quantity of the solution. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain a solid product. This solid product was dissolved in ethanol, added slowly to ice water and subjected to re-precipitation. The precipitate was recovered and dried to obtain poly(triethyltitanyl methacrylate-methyl methacrylate). Yield, 75%, Mn, 35,000; Mw/Mn=2.2, IR ($\nu$ cm$^{-1}$), 1720, 1710, 1160, 1100, 720; atomic absorption spectrum (Ti content), 14.80 (found) and 14.95 (calculated).

EXAMPLE 47

The polymer prepared in Example 46 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 15.0 μC/cm² and there was no loss of the film in the unexposed areas.

EXAMPLE 48

The flat layer on the wafer patterned in Example 47 was dry-etched under the same conditions as in Example 3. The etching speed was 65 Å/min.

EXAMPLE 49

To the polymer prepared in Example 46, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 15.0 μC/cm² and there was no loss of the film in the unexposed areas.

EXAMPLE 50

The flat layer on the wafer patterned in Example 49 was dry-etched under the same conditions as in Example 3. The etching speed was 65 Å/min.

EXAMPLE 51

To the polymer prepared in Example 46, 9-cyanoanthracene was added in an amount of 3% of the polymer and an MEK solution having an overall concentration of 10% was formed. This solution was coated, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 9.6 μC/cm² and there was no loss of the film in the unexposed areas.

EXAMPLE 52

The flat layer on the wafer patterned in Example 51 was dry-etched with an oxygen plasma under the same conditions as in Example 3. The etching speed was 65 Å/min.

EXAMPLE 53

To the polymer prepared in Example 46, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.6 μC/cm² and there was no loss of the film in the unexposed areas.

EXAMPLE 54

The flat layer on the wafer patterned in Example 53 was dry-etched with an oxygen plasma under the same conditions as in Example 3. The etching speed was 65 Å/min.

EXAMPLE 55

α-Chloroacrylic acid (0.1 mol), hexaethyldititanoxane (0.05 mol), α-chloromethyl acrylate (0.1 mol), 2-pentene (0.1 mol) and benzoyl peroxide (0.004 mol) were charged into an ampule and dissolved in benzene to form a solution having an overall concentration of ca. 50%. The ampule was evacuated to 10$^{-4}$ Torr with a diffusion pump and SO$_2$ gas (0.1 mol) was introduced into the ampule through a vacuum line. Thereafter, the ampule was sealed and reaction was carried out for 8 hours at 70° C. in an SO$_2$ gas atmosphere. After the reaction, the ampule was opened and the content was added to n-hexane and subjected to re-precipitation. The precipitate was recovered and dried to obtain poly-(α-chlorotriethyl-titanyl acrylate/α-chloromethyl acrylate/2-pentenesulfone). Yield, 62%; Mn, 45,000; Mw/Mn=1.4; IR ($\nu$cm$^{-1}$), 1725, 1700, 1350, 1160, 700; atomic absorption spectrum (Ti content), 9.9 (found) and 10.23 (calculated).

EXAMPLE 56

The polymer prepared in Example 55 was dissolved in MEK to form a 10% solution. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 $\mu$m L/S) was obtained. The sensitivity was 1.5 $\mu$C/cm$^2$ and there was no loss of the film in the unexposed areas.

EXAMPLE 57

The flat layer on the wafer patterned in Example 55 was dry-etched with an oxygen plasma under the same conditions as in Example 3. The etching speed was 65 Å/min.

EXAMPLE 58

The wafer patterned in Example 55 was set in a dry etching apparatus and the flat layer on the wafer was dry-etched with a Freon/O$_2$ mixed gas plasma at a Freon/O$_2$ pressure of 10 Pa and an RF output of 150 W. The etching speed was 30 Å/min.

EXAMPLE 59

To the polymer prepared in Example 55, triphenylsulfonium tetrafluoroborate was added in an amount of 3% of the polymer and an MEK solution having an overall concentration of 10% was formed. This solution was coated onto an Si wafer, prebaked and exposed to electron beams under the same conditions as in Example 2. Subsequently, development was performed for 1 minute with a liquid mixture of methanol and MBA, whereby a positive fineline pattern (0.2 $\mu$m L/S) was obtained. The sensitivity was 0.8 $\mu$C/cm$^2$ and there was no loss of the film in the unexposed areas.

EXAMPLE 60

The flat layer on the wafer patterned in Example 59 was dry-etched with an oxygen plasma under the same conditions as in Example 3. The etching speed was 65 Å/min.

EXAMPLE 61

The flat layer on the wafer patterned in Example 59 was dry-etched with a Freon/O$_2$ mixed gas plasma under the same conditions as in Example 58. The etching speed was 30 Å/min.

EXAMPLE 62

To the polymer prepared in Example 55, 9-cyanoanthracene was added in an amount of 3% and an MEK solution having an overall concentration of 10% was formed. This solution was coated onto an Si wafer, prebaked and exposed to electron beams under the same conditions as in Example 2, whereby a positive fineline pattern (0.2 $\mu$m L/S) was obtained. The sensitivity was 0.6 $\mu$C/cm$^2$ and there was no loss of the film in the unexposed areas.

EXAMPLE 63

The flat layer on the wafer patterned in Example 62 was dry-etched with an oxygen plasma under the same conditions as in Example 3. The etching speed was 65 Å/min.

EXAMPLE 64

The flat layer on the wafer patterned in Example 62 was dry-etched with a Freon/O$_2$ mixed gas plasma under the same conditions as in Example 58. The etching speed was 30 Å/min.

EXAMPLE 65

To the polymer prepared in Example 55, triphenylsulfonium tetrafluoroborate and 9-cyanoanthracene were added at a ratio of 1:1 in a total amount of 3% of the polymer and an MEK solution having an overall concentration of 10% was formed. This solution was coated onto an Si wafer, prebaked and exposed to electron beams under the same conditions as in Example 2. Subsequently, development was conducted for 1 minute with a liquid mixture of methanol and MBA, whereby a positive fineline pattern (0.2 $\mu$m L/S) was obtained. The sensitivity was 0.2 $\mu$C/cm$^2$ and there was no loss of the film in the unexposed areas.

EXAMPLE 66

The flat layer on the wafer patterned in Example 65 was dry-etched with an oxygen plasma under the same conditions as in Example 3. The etching speed was 65 Å/min.

EXAMPLE 67

The flat layer on the wafer patterned in Example 65 was dry-etched with a Freon/O$_2$ mixed gas plasma under the same conditions as in Example 58. The etching speed was 30 Å/min.

EXAMPLE 68

$\alpha$-n-Propyl acrylic acid (0.1 mol) and hexaethyldititanoxane (0.05 mol) were dissolved in xylene and subjected to reaction. The water that formed as the reaction proceeded was removed together with the solvent by distillation. The by-product of the reaction was distilled off under vacuum and dried under vacuum to obtain triethyltitanyl-$\alpha$-n-propyl acrylate (m.p. 89° C.; yield, 54%). $\alpha$-n-Propylacrylic acid (0.1 mol 0 and dicarbonyl chlorotropylium tungsten (0.1 mol) were dissolved in xylene and subjected to reaction. The water that formed as the reaction proceeded was removed together with the solvent by distillation. The by-product of the reaction was distilled off under vacuum and dried under vacuum to obtain dicarbonyl tropylium tungstenyl-$\alpha$-n-propyl acrylate (m.p. 110° C.; yield, 40%). The thus obtained triethyltannyl-$\alpha$-n-propyl acrylate and dicarbonyl tropylium tungstenyl-$\alpha$-n-propyl acrylate were put into a round-bottom flask at a molar ratio of 1:1 and xylene was added to achieve a concentration of ca. 50%. Benzoyl peroxide (1 mol % of the sum of the triethyltitanyl-$\alpha$-n-propyl acrylate and dicarbonyl tropylium tungstenyl-$\alpha$-n-propyl acrylate) dissolved in xylene was charged into a dropping funnel. After equipping the flask with this funnel, the benzoyl peroxide solution was dripped in an amount of about 10% of the total quantity of the solution. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain a solid product. This solid product was dissolved in ethanol, added slowly to ice water and subjected to re-precipitation. The precipitate was recovered and dried to obtain poly(triethyltitanyl-α-n-propyl acrylate/dicarbonyl tropylium tungstenyl-α-n-propyl acrylate). Yield, 52%, Mn, 20,000; Mw/Mn=1,5, IR ($\nu$ cm$^{-1}$), 1715, 1710, 1100, 780, 720; atomic absorption spectrum (Ti content), 8.00 (found) and 8.50 (calculated); atomic absorption spectrum (W content), 11.00 (found) and 10.95 (calculated).

EXAMPLE 69

The polymer prepared in Example 68 was dissolved in MEK to form a 10% solution. This solution was coated onto an Si wafer, prebaked in a convertible oven, and exposed to electron beams under the same conditions as in Example 2. Subsequently, development was conducted for 1 minute with a liquid mixture of methanol and MBA, whereby a positive fineline pattern (0.2 μm L/S) was obtained. The sensitivity was 25.0 μC/cm$^2$ and there was no loss of the film in the unexposed areas.

EXAMPLE 70

The flat layer on the wafer patterned in Example 69 was dry-etched with an oxygen plasma under the same conditions as in Example 3. The etching speed was 55 Å/min.

EXAMPLE 71

α-n-Propyl acrylic acid (0.1 mol) and hexaethyldititanoxane (0.05 mol) were dissolved in xylene and subjected to reaction. The water that formed as the reaction proceeded was removed together with the solvent by distillation. The by-product of the reaction was distilled off under vacuum and dried under vacuum to obtain α-chlorotriethyltitanyl acrylate (m.p. 83° C.; yield, 54%). This α-chlorotriethyltitanyl acrylate was put into a round-bottom flask and xylene was added to achieve a concentration of ca. 50%. As a polymerization initiator, benzoyl peroxide (1 mol % of α-chlorotriethyltitannyl acrylate) dissolved in xylene was charged into a dropping funnel. After equipping the flask with this funnel, the benzoyl peroxide solution was dripped in an amount of 10% of the total quantity of the solution. Thereafter, the flask was heated to the reflux temperature and the remaining initiator was slowly added dropwise until the reaction was completed in 8 hours. After the reaction, the content of the flask was added to n-hexane and subjected to re-precipitation. The resulting precipitate was recovered and dried to obtain poly(α-chlorotriethyltitanyl acrylate). Yield, 60%, Mn, 52,000; Mw/Mn=1.5, IR ($\nu$ cm$^{-1}$), 1700, 700; atomic absorption spectrum (Ti content), 19.75 (found) and 19.90 (calculated).

EXAMPLE 72

The polymer prepared in Example 71 was dissolved in MEK to form a 10% solution. This solution was coated onto an Si wafer, prebaked in a convertible oven, and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 5.0 μC/cm$^2$ and there was no loss of the film in the unexposed areas.

EXAMPLE 73

The flat layer on the wafer patterned in Example 72 was dry-etched with an oxygen plasma under the same conditions as in Example 3. The etching speed was 60 Å/min.

EXAMPLE 74

The flat layer on the wafer patterned in Example 72 was dry-etched with a Freon/O$_2$ mixed gas plasma under the same conditions as in Example 58. The etching speed was 28 Å/min.

EXAMPLE 75

α-Chloroacrylic acid (0.1 mol) and hexaethyldititanoxane (0.05 mol) were dissolved in xylene and subjected to reaction. The water that formed as the reaction proceeded was removed together with the solvent by distillation. The by-product of the reaction was distilled off under vacuum and the residue dried under vacuum to obtain α-chlorotriethyltitanyl acrylate (m.p. 83° C.; yield, 54%). This α-chlorotriethyltitanyl acrylate and methyl α-chloroacrylate ware put into a round-bottom flask at a molar ratio of 1:1 and xylene was added to attain a concentration of ca. 50%. Benzoyl peroxide (1 mol % of the sum of α-chlorotriethyltitanyl acrylate/and methyl α-chloroacrylate) dissolved in xylene was charged into a dropping funnel. After equipping the flask with this funnel, the benzoyl peroxide solution was dripped in an amount of about 10% of the total quantity. Thereafter, the flask was heated to the reflux temperature and the remaining polymerization initiator was slowly added dropwise until the reaction was completed in 8 hours. After the reaction, the content of the flask was added to n-hexane and subjected to re-precipitation. The resulting precipitate was recovered and dried to obtain a solid product. This solid product was dissolved in ethanol, slowly added to ice water and subjected to re-precipitation. The precipitate was recovered and dried to obtain poly (α-chlorotriethyltitanyl acrylate/methyl α-chloroacrylate). Yield, 65%, Mn, 45,000; Mw/Mn = 1, 6, IR($\nu$ cm$^{-1}$), 1725, 1700, 700; atomic absorption spectrum (Ti content), 13.25 (found) and 13.26 (calculated).

EXAMPLE 76

The polymer prepared in Example 75 was dissolved in MEK to form a 10% solution. This solution was coatd onto an Si wafer, prebaked in a convertible oven, and exposed to electron beams under the same conditions as in Example 2. Subsequently, development was performed for 1 minute with a liquid mixture of methanol and MBA, whereby a positive fineline pattern (0.2 μm L/S) was obtained. The sensitivity was 3.5 μC/cm$^2$ and there was no loss of the film in the unexposed areas.

EXAMPLE 77

The flat layer on the wafer patterned in Example 76 was dry-etched with an oxygen plasma under the same conditions as in Example 3. The etching speed was 65 Å/min.

EXAMPLE 78

The flat layer on the wafer patterned in Example 76 was dry-etched with a Freon/O$_2$ mixed gas plasma under the same conditions as in Example 58. The etching speed was 30 Å/min.

COMPARATIVE EXAMPLE 1

Methyl methacrylate (0.1 mol) was put into a round-bottom flask and dissolved in xylene to form a solution having an approximate concentration of 50%. To this solution, a polymerization initiator composed of benzoyl peroxide (0.01 mol) in xylene was dripped through a dropping funnel in an amount of 10% of the total quantity. Thereafter, the flask was heated to the reflux temperature and the remaining initiator was slowly added dropwise until the reaction was completed in 8 hours. After the reaction, the content of the flask was added to n-hexane and subjected to re-precipitation. The resulting precipitate was recovered and dried to obtain PMMA (yield, 90%; Mn, 100,000).

The thus obtained PMMA was dissolved in MEK to form a 10% solution. This solution was spin-coated onto an Si wafer in two stages (the rotational speed was 1,200 rpm in the first stage and increased to 1,800 rpm in the second stage). Prebaking was then performed in a convertible oven at 80° C. for 30 minutes. Thereafter, the prebaked wafer was exposed to electron beams with an electron beam exposure apparatus at an acceleration voltage of 20 keV. Subsequently, development was performed for 1 minute with a liquid mixture of isopropanol and methyl isobutyl ketone. By rinsing in isopropanol for 20 seconds, a positive fineline pattern (0.2 μm L/S) was obtained. The sensitivity was 5 μC/cm² and the film in the unexposed areas was lost by 12.0%.

COMPARATIVE EXAMPLE 2

The flat layer on the wafer patterned in Comparative Example 1 was dry-etched with an oxygen plasma under the same conditions as in Example 3. The etching speed was 5,200 Å/min.

COMPARATIVE EXAMPLE 3

The flat layer on the wafer patterned in Comparative Example 1 was dry-etched with a Freon/O₂ mixed gas plasma under the same conditions as in Example 58. The etching speed was 6,400 Å/min.

What is claimed is:

1. A radiation-sensitive polymer that contains at least one unit represented by the general formula (I):

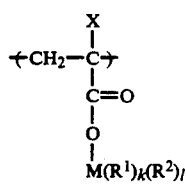

(I)

wherein X is an alkyl group, a halogen atom or a halogenated alkyl group; R¹ is an alkyl group, an alkoxy group or an aryl group; R² is carbon monoxide; M is Ge, Sn, Ti, Mo or W; k is a number defined by the valence of (M minus 1); and l is zero or a positive integer provided that l is zero in the case that M is Ge or Sn, and a moiety having the general formula (II):

wherein Y is an alkyl group, a halogen atom or a halogenated alkyl group; and R³ is an alkyl or an aryl group.

2. A radiation-sensitive polymer as claimed in claim 1, said polymer being poly(tri-n-butylstannyl methacrylate).

3. A radiation-sensitive polymer as claimed in claim 1, said polymer being poly(tri-n-butylstannyl methacrylate-ethyl methacrylate).

4. A radiation-sensitive polymer as claimed in claim 1, said polymer being poly(triethyl germane methacrylate).

5. A radiation-sensitive polymer as claimed in claim 1, said polymer being poly(triethyl germane methacrylate-methyl methacrylate).

6. A radiation-sensitive polymer as claimed in claim 1, said polymer being poly(triethyltitanyl methacrylate).

7. A radiation-sensitive polymer as claimed in claim 1, said polymer being poly(triethyltitanyl methacrylate-methyl methacrylate).

8. A radiation-sensitive polymer as claimed in claim 1, said polymer being poly(α-chlorotriethyl-titanyl acrylate/α-chloromethyl acrylate/2-pentenesulfone).

9. A radiation-sensitive polymer as claimed in claim 1, said polymer being poly(triethyltitanyl-α-n-propyl acrylate/dicarbonyl tropylium tungstenyl-α-n-propyl acrylate).

10. A radiation-sensitive polymer as claimed in claim 1, said polymer being poly(α-chlorotriethyltitanyl acrylate).

11. A radiation-sensitive polymer as claimed in claim 1, said polymer being poly(α-chlorotriethyltitanyl acrylate/methyl α-chloroacrylate).

12. A radiation-sensitive polymer that contains at least one unit represented by the general formula (I):

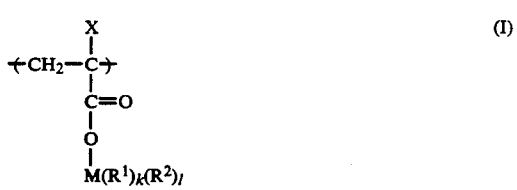

(I)

wherein X is an alkyl group, a halogen atom or a halogenated alkyl group; R¹ is an alkyl group, an alkoxy group or an aryl group; R² is carbon monoxide; M is Ge, Sn, Ti, Mo or W; k is a number defined by the valence of (M minus 1); and l is zero or a positive integer provided that l is zero in the case that M is Ge or Sn, a moiety having the general formula (III):

(III)

wherein R⁴ is a divalent alkyl or aryl group.

13. A radiation-sensitive polymer as claimed in claim 1 or 12, wherein X is an alkyl group.

14. A radiation-sensitive polymer as claimed in claim 13, wherein the alkyl group is selected from the group consisting of methyl, ethyl, n-propyl, isopropyl, n-butyl, t-butyl, n-pentyl, isopentyl, and neopentyl groups.

15. A radiation-sensitive polymer as claimed in claim 1 or 12, wherein X is a halogen atom.

16. A radiation-sensitive polymer as claimed in claim 15, wherein the halogen atom is chlorine or bromine.

17. A radiation-sensitive polymer as claimed in claim 1 or 12, wherein X is a halogenated alkyl group.

18. A radiation-sensitive polymer as claimed in claim 17, wherein the halogenated alkyl group is selected from the group consisting of chloromethyl, dichloromethyl, trichloromethyl, 1-chloroethyl, 2-chloroethyl, 1,1-dichloroethyl, 1,2-dichloroethyl, 1,1,2-trichloroethyl, 1,2,2-trichloroethyl, 2,2,2-trichloroethyl, 1,1,2,2-tetrachloroethyl, 1,2,2,2-tetrachloroethyl, 1,1,2,2,2-pentachloroethyl, bromomethyl, dibromomethyl, tribromomethyl, 1-bromoethyl, 2-bromomethyl, 1,1-dibromoethyl, 1,2-dibromoethyl, 1,1,2-tribromoethyl, 1,2,2-tribromoethyl, 2,2,2-tribromoethyl, 1,1,2,2-tetrabromoethyl, 1,2,2,2-tetrabromoethyl and 1,1,2,2,2-pentabromoethyl groups.

19. A radiation-sensitive polymer as claimed in claim 18, wherein X is trichloromethyl.

20. A radiation-sensitive polymer as claimed in claim 1 or 12, wherein $R^1$ is an alkyl group containing no more than five carbon atoms.

21. A radiation-sensitive polymer as claimed in claim 1 or 12, wherein $R^1$ is an alkoxy group containing no more than five carbon atoms.

22. A radiation-sensitive polymer as claimed in claim 1 or 12, wherein $R^1$ is an alkoxy group selected from the group consisting of methoxy and ethoxy.

23. A radiation-sensitive polymer as claimed in claim 1 or 12, wherein $R^1$ is an aryl group.

24. A radiation-sensitive polymer as claimed in claim 23, wherein the aryl group is selected from the group consisting of phenyl, toluyl, m-nitrophenyl, and p-acetylphenyl.

25. A radiation-sensitive polymer as claimed in claim 1 or 12, wherein Y is an alkyl group.

26. A radiation-sensitive polymer as claimed in claim 25, wherein the alkyl group is selected from the group consisting of methyl, ethyl, n-propyl, isopropyl, n-butyl, t-butyl, n-pentyl, isopentyl, and neopentyl groups.

27. A radiation-sensitive polymer as claimed in claim 1 or 2, wherein Y is a halogen atom.

28. A radiation-sensitive polymer as claimed in claim 27, wherein the halogen atom is chlorine or bromine.

29. A radiation-sensitive polymer as claimed in claim 1 or 12, wherein Y is a halogenated alkyl group.

30. A radiation-sensitive polymer as claimed in claim 29, wherein the halogenated alkyl group is selected from the group consisting of chloromethyl, dichloromethyl, trichloromethyl, 1-chloroethyl, 2-chloroethyl, 1,1-dichloroethyl, 1,2-dichloroethyl, 1,1,2-trichloroethyl, 1,2,2-trichloroethyl, 2,2,2-trichloroethyl, 1,1,2,2-tetrachloroethyl, 1,2,2,2-tetrachloroethyl and 1,1,2,2,2-pentachloroethyl, bromomethyl, dibromomethyl, tribromomethyl, 1-bromoethyl, 2-bromomethyl, 1,1-dibromoethyl, 1,2-dibromoethyl, 1,1,2-tribromoethyl, 1,2,2-tribromoethyl, 2,2,2-tribromoethyl, 1,1,2,2-tetrabromoethyl, 1,2,2,2-tetrabromoethyl and 1,1,2,2,2-pentabromoethyl groups.

31. A radiation-sensitive polymer as claimed in claim 30, wherein the halogenated alkyl group is trichloromethyl.

32. A radiation-sensitive polymer as claimed in claim 1 or 12, wherein $R^3$ is an alkyl group containing no more than ten carbon atoms.

33. A radiation-sensitive polymer as claimed in claim 1 or 12, wherein $R^3$ is an alkyl or aryl group selected from the group consisting of phenyl, toluyl, m-nitrophenyl, p-acetylphenyl, n-pentyl, isopentyl, neopentyl, n-hexyl, isohexyl, heptyl, octyl, nonyl and decanyl, methyl, ethyl, n-propyl, n-butyl, t-butyl, and m-cyanophenyl groups.

34. A radiation-sensitive polymer as claimed in claim 1 or 12, wherein $R^4$ is a divalent alkyl group selected from the group consisting of methylene, ethylene, n-propylene, n-butylene, and t-butylene groups.

35. A radiation-sensitive polymer as claimed in claim 1 or 12, wherein $R^4$ is a divalent aryl group selected from the group consisting of o-phenylene, p-phenylene, 1,3-o-toluylene, 1,4-o-toluylene, 1,5-m-toluylene, and 1,3-o-nitrobenzylylene groups.

36. A radiation-sensitive polymer as claimed in claim 1 or 12, wherein said radiation-sensitive polymer contains at least about 2% of the unit represented by the general formula (I).

37. A radiation-sensitive polymer as claimed in claim 1 or 12, wherein said radiation-sensitive polymer contains at least about 4.5% of the unit represented by the general formula (I).

38. A radiation-sensitive polymer as claimed in claim 1 or 12, wherein the ratio of the unit represented by the general formula (I) to the unit represented by the general formula (II) is between about 1:0.5 and 1:45.

39. A radiation-sensitive polymer as claimed in claim 1 or 12, wherein the ratio of the unit represented by the general formula (I) to the unit represented by the general formula (II) is between about 1:8 and 1:45.

40. A radiation-sensitive polymer as claimed in claim 1 or 12, wherein the ratio of the unit represented by the general formula (I) to the unit represented by the general formula (III) is between about 1:0.5 and 1:20.

41. A radiation-sensitive polymer as claimed in claim 1 or 12, wherein the ratio of the unit represented by the general formula (I) to the unit represented by the general formula (III) is between about 1:1 and 1:15.

42. A radiation-sensitive polymer as claimed in claim 1 or 12, wherein the radiation-sensitive polymer has an average molecular weight between about 20,000 and 500,000.

43. A radiation-sensitive polymer as claimed in claim 1 or 12, wherein the radiation-sensitive polymer is capable of forming a thin film.

44. A radiation-sensitive polymer as claimed in claim 1 or 12, wherein said polymer contains two or more units represented by the general formula (II).

45. A composition containing a radiation-sensitive polymer, wherein the polymer consists of at least one unit represented by the general formula (I):

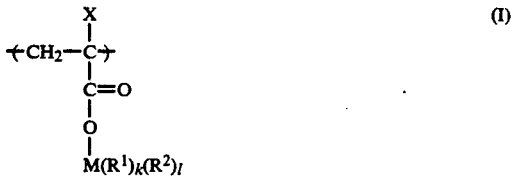

and wherein X is an alkyl group, a halogen atom or a halogenated alkyl group; $R^1$ is an alkyl group, an alkoxy group or an aryl group; $R^2$ is carbon monoxide; M is Ge, Sn, Ti, Mo or W; k is a number defined by the valence of (M minus 1); and l is zero or a positive integer provided that l is zero in the case that M is Ge or Sn, and a moiety having the general formula (II):

and wherein Y is an alkyl group, a halogen atom or a halogenated alkyl group; and R³ is an alkyl or an aryl group.

46. A composition containing a radiation-sensitive polymer, wherein the polymer consists of at least one unit represented by the general formula (I):

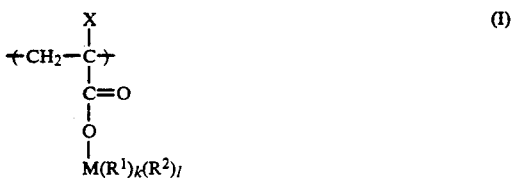

and wherein X is an alkyl group, a halogen atom or a halogenated alkyl group; R¹ is an alkyl group, an alkoxy group or an aryl group; R² is carbon monoxide; M is Ge, Sn, Ti, Mo or W; k is a number defined by the valence of (M minus 1); and l is zero or a positive integer provided that l is zero in the case that M is Ge or Sn and a moiety having the general formula (III):

and wherein R⁴ is a divalent alkyl or aryl group.

47. A composition as claimed in claim 45 or 46, further comprising a compound that generates an acid in response to radiation.

48. A composition as claimed in claim 47, further comprising a compound that provides enhanced radiation sensitivity.

49. A composition as claimed in claim 48, wherein X is an alkyl group selected from the group consisting of methyl, ethyl, n-propyl, isopropyl, n-butyl, t-butyl, n-pentyl, isopentyl, and neopentyl groups.

50. A composition as claimed in claim 48, wherein X is a halogen atom.

51. A composition as claimed in claim 50 wherein X is a chlorine or bromine.

52. A composition as claimed in claim 50, wherein X is a halogenated alkyl group selected from the group consisting of chloromethyl, dichloromethyl, trichloromethyl, 1-chloroethyl, 2-chloroethyl, 1,1-dichloroethyl, 1,2-dichloroethyl, 1,1,2-trichloroethyl, 1,2,2-trichloroethyl, 2,2,2-trichloroethyl, 1,1,2,2-tetrachloroethyl, 1,2,2,2-tetrachloroethyl and 1,1,2,2,2-pentachloroethyl, bromomethyl, dibromomethyl, tribromomethyl, 1-bromoethyl, 2-bromomethyl, 1,1-dibromoethyl, 1,2-dibromoethyl, 1,1,2-tribromoethyl, 1,2,2-tribromoethyl, 2,2,2-tribromoethyl, 1,1,2,2-tetrabromoethyl, 1,2,2,2-tetrabromoethyl and 1,1,2,2,2-pentabromoethyl groups.

53. A composition as claimed in claim 48, wherein R¹ is an alkyl group containing no more than five carbon atoms.

54. A composition as claimed in claim 48, wherein R¹ is an alkoxy group containing no more than five carbon atoms.

55. A composition as claimed in claim 48, wherein R¹ is an aryl group selected from the group consisting of phenyl, toluyl, m-nitrophenyl, p-acetylphenyl, and m-cyanophenyl.

56. A composition as claimed in claim 48, wherein Y is an alkyl group selected from the group consisting of methyl, ethyl, n-propyl, isopropyl, n-butyl, t-butyl, n-pentyl, isopentyl, and neopentyl groups.

57. A composition as claimed in claim 48, wherein Y is a halogen atom.

58. A composition as claimed in claim 48, wherein Y is a halogenated alkyl group selected from the group consisting of chloromethyl, dichloromethyl, trichloromethyl, 1-chloroethyl, 2-chloroethyl, 1,1-dichloroethyl, 1,2-dichloroethyl, 1,1,2-trichloroethyl, 1,2,2-trichloroethyl, 2,2,2-trichloroethyl, 1,1,2,2-tetrachlorethyl, 1,2,2,2-tetrachloroethyl and 1,1,2,2,2-pentachloroethyl, bromomethyl, dibromomethyl, tribromomethyl, 1-bromoethyl, 2-bromomethyl, 1,1-dibromoethyl, 1,2-dibromoethyl, 1,1,2-tribromoethyl, 1,2,2-tribromoethyl, 2,2,2-tribromoethyl, 1,1,2,2-tetrabromethyl, 1,2,2,2-tetrabromoethyl and 1,1,2,2,2-pentabromoethyl groups.

59. A composition as claimed in claim 48, wherein R³ is an alkyl group containing no more than ten carbon atoms.

60. A composition as claimed in claim 48, wherein R³ is an alkyl or aryl group selected from the group consisting of phenyl, toluyl, m-nitrophenyl, p-acetylphenyl, n-pentyl, isopentyl, neopentyl, n-hexyl, isohexyl, heptyl, octyl, nonyl decanyl, methyl, ethyl, n-propyl, n-butyl, t-butyl and m-cyanophenyl groups.

61. A composition as claimed in claim 48, wherein R⁴ is a divalent alkyl group selected from the group consisting of methylene, ethylene, n-propylene, n-butylene, and t-butylene groups.

62. A composition as claimed in claim 48, wherein R⁴ is a divalent aryl group selected from the group consisting of o-phenylene, p-phenylene, 1,3-o-toluylene, 1,4-o-toluylene, 1,5-m-toluylene, and 1,3-o-nitrobenzylylene groups.

63. A composition as claimed in claim 48, wherein the radiation-sensitive polymer contains at least about 2% of the unit represented by the general formula (I).

64. A composition as claimed in claim 48, wherein said radiation-sensitive polymer contains at least about 4.5% of the unit represented by the general formula (I).

65. A composition as claimed in claim 48, wherein the ratio of the unit represented by the general formula (I) to the unit represented by the general formula (II) is between about 1:0.5 and 1:45.

66. A composition as claimed in claim 48, wherein the ratio of the unit represented by the general formula (I) to the unit represented by the general formula (II) is between about 1:8 and 1:45.

67. A composition as claimed in claim 48, wherein the ratio of the unit represented by the general formula (I) to the unit represented by the general formula (III) is between about 1:0.5 and 1:20.

68. A composition as claimed in claim 48, wherein the ratio of the unit represented by the general formula (I) to the unit represented by the general formula (III) is between about 1:1 and 1:15.

69. A composition as claimed in claim 48, further comprising an adhesion improving agent.

70. A composition as claimed in claim 48, wherein the compound that generates an acid is selected from the group consisting of salts of iodonium, sulfonium, phosphonium, bromonium, chloronium, oxysulfoxonium, oxosulfonium, sulfoxonium, selenium, telluronium and arsonium.

71. A composition as claimed in claim 48, wherein the compound that generates an acid is selected from the group consisting of triphenylsulfonium tetrafluoroborate, triphenylsulfonium hexafluoroantimonate, triphenylsulfonium hexafluoroarsinate, triphenylsulfonium hexafluorophosphate, triphenylsulfonium trifluorosulfonate, diphenyliodonium hexafluoroantimonate, diphenyliodonium hexafluoroantimonate, diphenyliodonium hexafluoroarsinate, diphenyliodonium hexafluorophosphate, 2,4,6-tris(trichloromethyl)triazine, 2-allyl-4,6-bis(trichloromethyl)triazine, $\alpha, \alpha, \alpha$-tribromomethylphenylsulfone, $\alpha,\alpha,\alpha,\alpha',\alpha',\alpha'$,-hexachloroxylylene, 2-nitrobenzyl ester of methylsulfonic acid, and 2-nitrobenzyl ester of acetic acid.

72. A composition as claimed in claim 48, wherein the compound that generates an acid is added in amounts of about 0.1% to 30% on a weight basis of the polymer.

73. A composition as claimed in claim 48, wherein the compound that generates an acid is added in amounts of about 3% to 15% on a weight basis of the polymer.

74. A composition as claimed in claim 48, wherein the compound that provides enhanced radiation sensitivity is selected from the group consisting of polynuclear aromatic compounds having at least one substituent in the class consisting of an amino group, a hydroxyl group, an alkoxy group and an acetamido group.

75. A composition as claimed in claim 48, wherein the compound that provides enhanced radiation sensitivity is selected from the group consisting of 4-methoxynaphthalene, 1,4-dicyanonaphthalene, 9-cyanophenanthrene, phenanthren-9-acetamide, 9-aminophenanthrene, 9-methoxyphenanthrene, 1-aminoanthracene, 2-aminoanthracene, 9-cyanoanthracene, 9,10-dicyanoanthracene, 2,6,9,10-tetracyanoanthracene, 1-methoxyperylene, 1-cyanoperylene, 1-acetamidoperylene, 1,7-dicyanoperylene, 2,8-dicyanoperylene, 2,8-dimethoxyperylene, 1,7-dihydroxyperylene, 2-acetamidofluorene, chrysoldine, 1,7-dicyanochrysene, 1,7-hydroxychrysene, and 2,8-diaminoperylene.

76. A composition as claimed in claim 48, wherein the compound that provides enhanced radiation sensitivity is added in amounts of about 0.1% to 20% on a weight basis of the polymer.

77. A composition as claimed in claim 48, wherein the compound that provides enhanced radiation sensitivity is added in amounts of about 1% to 10% on a weight basis of the polymer.

78. A composition as claimed in claim 48, wherein the composition is characterized by a high resistance to dry etching, thereby allowing pattern transfers to be carried out easily by etching substrates such as inorganic oxide films.

79. A composition as claimed in claim 48, wherein the polymer contains two or more units represented by the general formula (II), and wherein said units have different Y and $R^3$ groups.

80. A composition as claimed in claim 48, wherein the composition is capable of forming a thin film.

81. A composition containing a radiation-sensitive polymer as claimed in claim 48, said polymer being poly(tri-n-butylstannyl methacrylate).

82. A composition containing a radiation-sensitive polymer as claimed in claim 48, said polymer being poly(tri-n-butylstannyl methacrylate-ethyl methacrylate).

83. A composition containing a radiation-sensitive polymer as claimed in claim 48, said polymer being poly(triethyl germane methacrylate).

84. A composition containing a radiation-sensitive polymer as claimed in claim 48, said polymer being poly(triethyl germane methacrylate-methyl methacrylate).

85. A composition containing a radiation-sensitive polymer as claimed in claim 48, said polymer being poly(triethyltitanyl methacrylate).

86. A composition containing a radiation-sensitive polymer as claimed in claim 48, said polymer being poly(triethyltitanyl methacrylate-methyl methacrylate).

87. A composition containing a radiation-sensitive polymer as claimed in claim 48, said polymer being poly($\alpha$-chlorotriethyl-titanyl acrylate/$\alpha$-chloromethyl acrylate/2-pentenesulfone).

88. A composition containing a radiation-sensitive polymer as claimed in claim 48, said polymer being poly(triethyltitanyl-$\alpha$-n-propyl acrylate/dicarbonyl tropylium tungstenyl-$\alpha$-n-propyl acrylate).

89. A composition containing a radiation-sensitive polymer as claimed in claim 48, said polymer being poly($\alpha$-chlorotriethyltitanyl acrylate).

90. A composition containing a radiation-sensitive polymer as claimed in claim 48, said polymer being poly($\alpha$-chlorotriethyltitanyl acrylate/methyl $\alpha$-chloroacrylate).

* * * * *